US012785618B2

(12) United States Patent
Braginsky et al.

(10) Patent No.: US 12,785,618 B2
(45) Date of Patent: Nov. 3, 2026

(54) ARC DETECTION SYSTEM, DEVICE AND METHOD

(71) Applicant: Solaredge Technologies Ltd., Herzeliya (IL)

(72) Inventors: David Braginsky, Yokne'am (IL); Gil Litmanovitch, Mazkeret Batya (IL)

(73) Assignee: Solaredge Technologies Ltd., Herzeliya (IL)

( * ) Notice: Subject to any disclaimer, the term of this patent is extended or adjusted under 35 U.S.C. 154(b) by 78 days.

(21) Appl. No.: 18/408,756

(22) Filed: Jan. 10, 2024

(65) Prior Publication Data

US 2024/0243696 A1 Jul. 18, 2024

Related U.S. Application Data

(60) Provisional application No. 63/479,778, filed on Jan. 13, 2023.

(51) Int. Cl.

| | |
|---|---|
| ***G01R 31/11*** | (2006.01) |
| ***G01R 31/52*** | (2020.01) |
| ***H02H 1/00*** | (2006.01) |
| ***H02S 50/10*** | (2014.01) |

(52) U.S. Cl.

CPC .............. *H02S 50/10* (2014.12); *G01R 31/11* (2013.01); *G01R 31/52* (2020.01); *H02H 1/0015* (2013.01)

(58) Field of Classification Search

CPC .............. G01R 31/50–72; G01R 31/11; G01R 31/1227; H02H 1/0015; H02S 50/10–15

See application file for complete search history.

(56) References Cited

U.S. PATENT DOCUMENTS

| | | | | |
|---|---|---|---|---|
| 2007/0259256 | A1* | 11/2007 | Le Canut | H01M 8/04835 320/134 |
| 2010/0198424 | A1* | 8/2010 | Takehara | H10F 77/955 700/297 |
| 2014/0111220 | A1 | 4/2014 | Andersen | |
| 2014/0266238 | A1* | 9/2014 | Furse | G01R 31/11 324/533 |
| 2015/0212025 | A1* | 7/2015 | Francis-Buller | G01R 31/11 324/693 |
| 2016/0169957 | A1 | 6/2016 | Furse et al. | |
| 2017/0033735 | A1* | 2/2017 | Tsuda | H02S 50/00 |
| 2017/0207746 | A1* | 7/2017 | Yoscovich | H02H 1/0015 |
| 2020/0103445 | A1* | 4/2020 | Medina Garcia | G01R 31/58 |

FOREIGN PATENT DOCUMENTS

| | | | |
|---|---|---|---|
| CN | 102918571 A * | 2/2013 | H02S 40/345 |

OTHER PUBLICATIONS

M.U. Saleh, et al.; "An Overview of Spread Spectrum Time Domain Reflectometry Responses to Photovoltaic Faults"; IEEE Journal of Photovoltaics, IEEE, vol. 10, No. 3; Feb. 24, 2020.

C. Furse, et al.; "Spread Spectrum Time Domain Reflectometry for Complex Impedances: Application to PV Arrays"; 2018 IEEE Autotestcon, IEEE; Sep. 17, 2018.

M.U. Saleh, et al.; "Detection and Localization of Damaged Photovoltaic Cells and Modules Using Spread Spectrum Time Domain Reflectometry"; IEEE Journal of Photovoltaics, IEEE, vol. 11, No. 1; Oct. 26, 2020.

Jul. 4, 2024—European Search Report—EP App. No. 24151389.4.

* cited by examiner

*Primary Examiner* — Lee E Rodak
*Assistant Examiner* — Demetrius R Pretlow
(74) *Attorney, Agent, or Firm* — Banner & Witcoff, Ltd.

(57) ABSTRACT

Systems, apparatuses, and methods are described for detecting and preventing arcs in a photovoltaic (PV) power system.

19 Claims, 7 Drawing Sheets

ARC DETECTION SYSTEM, DEVICE AND METHOD

CROSS REFERENCE TO RELATED APPLICATIONS

This application claims priority to U.S. provisional application Ser. No. 63/479,778, filed Jan. 13, 2023, entitled "ARC DETECTION SYSTEM, DEVICE AND METHOD." The content of the foregoing application is incorporated by reference in its entirety.

BACKGROUND

An electric arc, also referred to herein as an arc, may be an electrical breakdown of a gas in a space between two arc terminals. The gas may be, for example, air. An arc may produce a prolonged electrical discharge causing electrical current to flow through the gas in the gap. An arc may be characterized by visible light emission, relatively high current density, and relatively high temperature. The breakdown voltage of the gap may be a combination of pressure, a distance between the arc terminals, and the type of gas surrounding the arc terminals. An electric arc may be a continuous discharge, and once the arc is established the increased current may result in a lower voltage between the arc terminals. Electrical devices, which may have arcing, include electrical switches (such as circuit breakers, relays, fuses, etc.), cables, and connectors (e.g., cable terminations or other connectors used to connect two electrical devices). An arc may be initiated when the two arc terminals are initially in contact and then drawn apart. As mentioned above, the arc terminals may be electrodes or electrical contacts of electrical switches and the arc may be initiated, for example, by the separation of the electrodes or electrical contacts in the electrical switches. Arcs may also be initiated when there is a gap formed in an electrical cable or an electrical connector connecting two electrical devices. In such an example, the arc terminals may be formed from conducting material on either side of the gap. The arc may occur in the gas-filled space in the break in the cable or connector and it may result in a relatively high temperature that is capable of melting or vaporizing materials of the cable or connector or other electric devices. Undesired or unintended electric arcing may have detrimental effects on electric power transmission, distribution systems, and electrical equipment. Uncontrolled electrical arcs may become destructive since, once initiated, the arc may draw more and more current (e.g., from a fixed-voltage supply) which may lead to the destruction of the electrical devices. If a circuit has enough current and voltage to sustain the arc, the arc may cause damage to the electrical devices such as melting of electrical conducting material, destruction of electrical insulation material, and fire.

SUMMARY

The following summary presents a simplified summary of certain features. The summary is not an extensive overview and is not intended to identify key or critical elements.

Systems, apparatuses, and methods are described for detecting and preventing arcs in a photovoltaic (PV) power system.

In some examples, circuitry may be configured to apply a plurality of voltage changes across a series connection of a plurality of devices. Each device may include at least one of a plurality of impedances. The circuitry may be configured to receive a plurality of reflections resulting from the applied voltage changes and estimate the plurality of impedances based on at least one of the plurality of reflections to determine a plurality of estimated impedances. The circuitry may be configured to repeat the applying, receiving, and estimating, to collect multiple sets of estimated impedances. The circuitry may be configured to send a notification based on the multiple sets of estimated impedances. The notification may indicate an arcing condition.

These and other features and advantages are described in greater detail below.

BRIEF DESCRIPTION OF THE DRAWINGS

Some features are shown by way of example, and not by limitation, in the accompanying drawings. In the drawings, like numerals reference similar elements.

DETAILED DESCRIPTION

Figure 1:
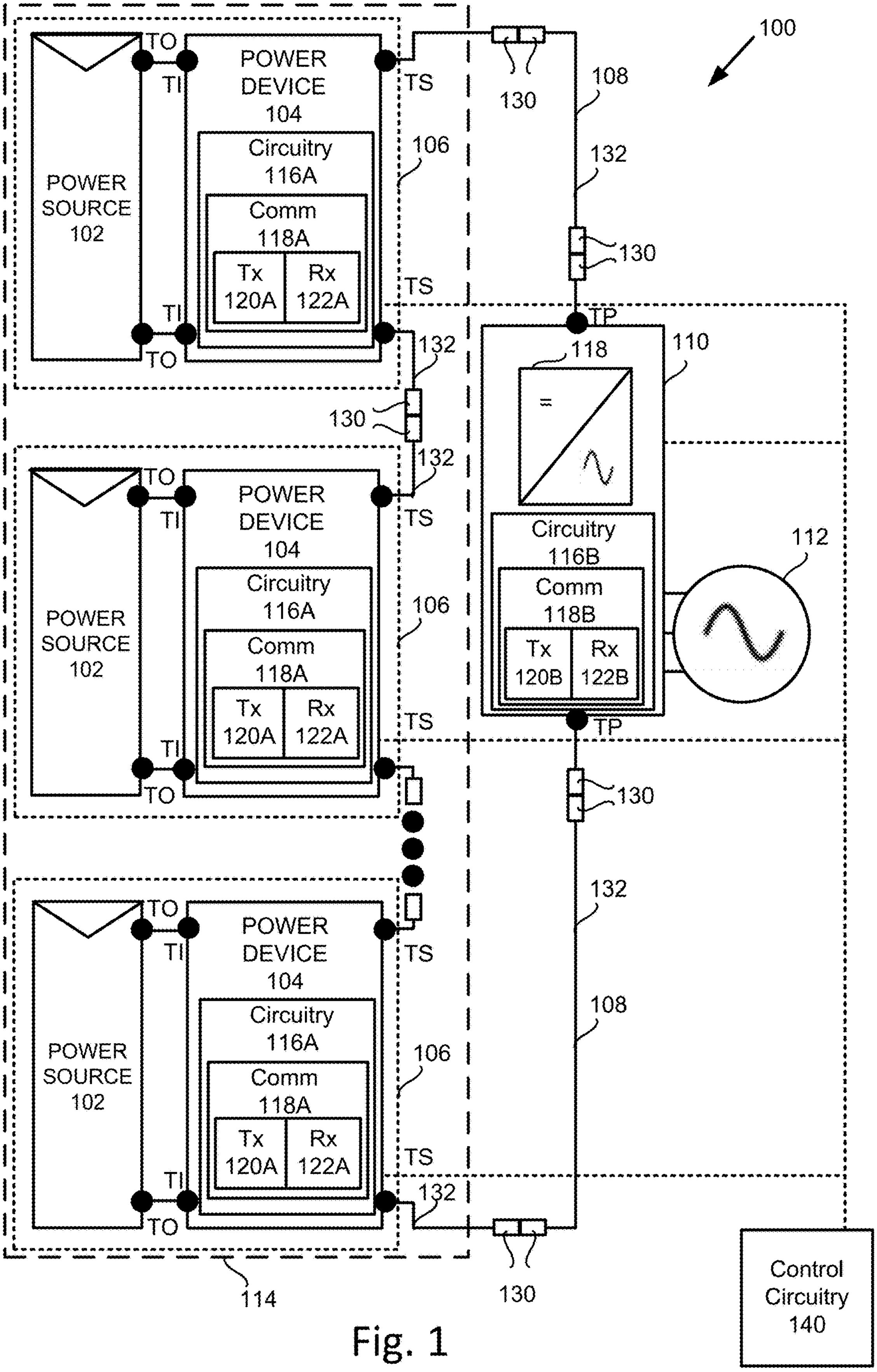
FIG. 1 shows an example power system.

The accompanying drawings, which form a part hereof, show examples of the disclosure. It is to be understood that the examples shown in the drawings and/or discussed herein are non-exclusive and that there are other examples of how the disclosure may be practiced.

Systems, apparatuses, and methods are described herein for arc detection. In some examples, circuitry may be configured to operate in both a training stage and an analysis stage. In the training stage, the circuitry may be trained to set a baseline of operation in which there are no arc conditions. The baseline may be used to set one or more thresholds for the analysis stage. In the analysis stage, the circuitry may determine an arc condition based on the baseline thresholds determined in the training stage. In some examples, in the training stage, the power system may be mapped. For example, each device (e.g., power device, power source, connector, etc.) in the power system may have an associated impedance. In the training stage, a map of the impedances of the devices of the power system may be determined. For example, in both the training stage and the analysis stage, a plurality of voltage changes and reflections may be used to estimate the impedances of the devices of the power system. In some examples, the voltage change may be selected from a plurality of voltage changes based on whether the power system is producing a significant amount of power and/or based on the amount of power produced by the power system. In some examples, the power system may temporarily reduce a power output in order to apply a voltage change for analysis. In some examples, the voltage change may be selected from a plurality of voltage changes based on the level of resolution desired to determine the arc condition. For example, a low-resolution voltage change may be used to determine that there is an arc condition, while a high-resolution voltage change may be used to determine further details related to that arc condition (e.g., a more exact location of the arc condition, a severity of the arc condition, etc.). In some examples, a system power device may apply voltage changes to one or more power devices, power sources, and/or connectors. In some examples, a power device may apply voltage changes to one or more other power devices, power sources, and/or connectors. For example, a voltage change applied by a system power device may be used to determine an arc condition, and a voltage change applied by a power device may be used to determine further details related to that arc condition.

In some examples, the power system may include a plurality of power sources and a plurality of power devices. Each power device may be connected to a respective power source. Each power device may include communication circuitry including transmitter circuitry and receiver circuitry. Each power device of the plurality of power devices may be configured to: receive a first reflection voltage related to a first applied voltage change, determine a first condition based on the first reflection voltage, receive a second reflection voltage related to a second applied voltage change, determine a second condition based on the second reflection voltage, and send a notification based on the first condition and the second condition. For example, the first condition may be determined in a training stage, and the second condition may be determined in an analysis stage. As another example, the first condition may be determined in a first analysis stage, and the second condition may be determined in a second analysis stage. For example, the first condition may be determined in a low-resolution analysis stage (e.g., when the power system is producing significant power and/or when the voltage change is applied by the system power device), and the second condition may be determined in high-resolution analysis stage (e.g., when the power system is not producing significant power and/or when the voltage change is applied by a power device). As another example, the first condition may be determined in the first analysis stage when there is no arcing or a lower priority arcing condition, and the second condition may be determined in a second analysis stage when there is arcing or a higher priority arcing condition.

In some examples, the first power device may be configured to connect to a second power device via an electrical cable. Transmitter circuitry may be configured to apply a plurality of applied voltage changes via the electrical cable to the second power device. Receiver circuitry may be configured to receive a plurality of reflection voltages related to the plurality of applied voltage changes (e.g., each reflection may be related to a respective voltage change). Circuitry may be configured to determine a plurality of arcing conditions of the electrical cable or electrical connectors based on the plurality of reflection voltages, and send a notification based on the plurality of arcing conditions.

In some examples, the transmitter circuitry and receiver circuitry may be used both for communication (e.g. between a system power device and power devices, or between power devices via the system power device) and for applying a voltage change (e.g., from the system power device to the power devices or to the power sources, or from the power device to another power device or to a power source) and receiving a reflection related to the voltage change. The reflection may be used to estimate an impedance.

In some examples, the impedance may be related to a power device, a power source, an electrical cable (e.g., a rupture in the cable), an electrical connector, etc. The transmitter circuitry may be configured to apply multiple voltage changes and the receiver circuitry may be configured to add a delay when sampling the reflections so that each sampled reflection may relate to a different impedance of the power system (e.g. to a different impedance in a series of impedances). The plurality of sampled reflections may be used to determine a set of estimated impedances which are related to the different impedances of the power system. The set of estimated impedances may be used to map the impedances of the power system. The set of estimated impedances may be used to determine a baseline for the power system when no arcing condition is present in the power system. For example, a plurality of sets of estimated impedances may be averaged in order to determine the baseline. The baseline may be used to determine whether there is an arc condition later on when the power system is operating, and the transmitter circuitry and receiver circuitry are used to obtain an additional plurality of sampled reflections and determine an additional set of estimated impedances which may be compared to the baseline to determine whether there is an arc condition. In some examples, determining the arc condition when comparing the additional set of estimated impedances to the baseline may be based on a new estimated impedance in the set of estimated impedances or an increase or decrease in the estimated impedances beyond a threshold (which may be representative of a new or increased rupture in the cable line or a fault in an electrical connector). Ruptures may occur in cables due to the wear down in cables over the passage of time, usage of the cable, an event physically disrupting or damaging the cable, etc.

In some examples, an arc condition may be identified in a series connection of a plurality of devices. Voltage changes may be applied in the series connection of devices by a central system power device that may be connected across the series connection of devices, or by an in-series power device. For example, the system power device and the power device may be power converters. For example, the system power device may be an inverter and the power device may be a DC-DC converter. The power device may be connected to a power source, such as a PV module. Each voltage change and its associated reflection may be related to at least one impedance. The impedance may be part of a power device, a PV module, a rupture in a cable connecting two devices, a physical connector connected to a cable of the device, etc. The plurality of reflections may be used in a training stage to set a baseline for the expected impedances that will be estimated due to the applied voltage changes when there is no arc condition. The plurality of reflections may be used in an analysis stage to be compared to the baseline from the training stage to determine an arc condition. In both the training stage and the analysis stage there may be a plurality of voltage changes as well as a plurality of reflections. Each voltage change may be associated with at least one reflection from at least one impedance. A plurality of reflections that map the plurality of impedances in the training stage or in the analysis stage may be considered a set of reflections that is used to determine a set of estimated impedances associated with the plurality of series connected devices. A plurality of sets of mapped estimated impedances may be used to train the system and determine the baseline responses to the voltage changes. A plurality of sets of mapped estimated impedances may be used for analysis of the system and determine based on the baseline from the training stage if there is an arc condition in the plurality of series connected devices. The arc condition may be identified by the sets of estimated impedances in the analysis stage deviating (e.g., greater than a threshold) from the baseline estimated impedances. In the analysis stage, other factors may be considered for determining the arc condition. The other factors may include, for example, temperature, weather, power production, impedance changes of other devices, etc.

In some examples, the power system may have a plurality of actual impedances (e.g., power devices, electrical cables with ruptures, connectors, etc.). The plurality of applied voltages and reflections may be used to estimate the impedances and map the impedances of the power system. For example, using a plurality of applied voltages and reflections associated with two strings of 10 power devices each that are attached in parallel to a system power device the circuitry may map estimated impedances for each of the power devices and the cables and connectors connecting the power devices that may be expected when there is no arc condition. The estimated impedances for the power system may be grouped into a set of estimated impedances. During the training stage, the mapping may be repeated so that there is a plurality of sets of estimated impedances. The plurality of sets of estimated impedances may be used to establish a baseline of expected impedances when there is no arc condition. The baseline may be established by averaging a plurality of sets of estimated impedances. The plurality of sets of estimated impedances and/or the baseline may be used to determine thresholds that may be used to determine an arc condition in the analysis stage. A similar process may be done in the analysis stage to prepare a set of estimated impedances (e.g., from a plurality of sets of estimated impedances) in order to determine an arc condition using the baseline and thresholds in comparison to the set of estimated impedances from the analysis stage. Similar to the training stage the voltage changes and reflections may be used to map the impedances over a period of time.

In some examples, the training stage may be performed to determine a reference (e.g., a reference set of impedances) to which other data may be compared (e.g., a later obtained set of impedances). Circuitry may be configured to perform the training stage may at an initial time when the power system is being set up and before the power system has begun producing power. Circuitry may be configured to perform the training stage daily or even multiple times per day. For example, the training stage may be performed when the power system is not producing power or is producing relatively low power (e.g., at the beginning of the day or end of the day or a break in the middle of the day where the systems power production may be turned off or disconnected from a power source in order to perform the training stage). As another example, the circuitry may be configured to perform the training stage when the system is producing relatively high power in order to determine a reference under high power conditions when there is no arc condition. In the analysis stage which may also be performed daily or multiple times per day, the obtained data (e.g. sets of estimated impedances) may be compared to the reference in order to determine an arc condition. The training stage may also be done under a range of conditions related to power production (e.g., high power production, low power production, relatively no power production, etc.).

In some examples, circuitry may be configured to determine an evaluation parameter associated with a plurality of impedances and an abnormality associated with at least one impedance of the plurality of impedances.

It is noted that the teachings of the presently disclosed subject matter are not bound by the systems and apparatuses described with reference to the figures. Equivalent and/or modified functionality may be consolidated or divided in another manner and may be implemented in any appropriate combination. For example, elements which are shown as separate units, may have their functionalities and/or components combined into a single unit.

It is also noted that like references in the various figures may refer to like elements throughout the application. Similar reference numbers may also connote similarities between elements. Throughout the application, certain general references may be used to refer to any of the specific related elements. For example, circuitry 116 may refer to circuitry 116A and/or circuitry 116B, electrical cable 132 may refer to electrical cable 132A and/or electrical cable 132B, etc.

It is also noted that all numerical values given in the examples of the description are provided for purposes of example only and do not exclude the use of other numerical values for the same feature.

The terms "substantially" and "about" are used herein to indicate variations that are equivalent to an intended purpose or function (e.g., within a permissible variation range). Certain values or ranges of values are presented herein with numerical values being preceded by the terms "substantially" and "about". The terms "substantially" and "about" are used herein to provide literal support for the exact number that it precedes, as well as a number that is near to or approximately the number that the term precedes. In determining whether a number is near to or approximately a specifically recited number, the near or approximating unrecited number may be a number, which, in the context in which it is presented, provides a substantial equivalent of the specifically recited number.

Control devices, including "controller," "control circuitry," "computer," "processor," "processing circuitry," and variations of these terms as used herein, include any analog or digital electronic hardware circuit capable of performing one or more logical or arithmetic functions. The functions may be based on a received signal (e.g., from a sensor that measures a physical parameter as in the various example described herein). Performance of the functions may cause an output of a signal (e.g., to control another device such as a switch or to provide an indication as in the various examples described herein). Such control devices include, by way of non-limiting examples, a digital signal processor (DSP), microprocessor, microcontroller, field programmable gate array (FPGA), application-specific integrated circuit (ASIC), embedded controller, analog comparator, analog-to-digital controller, digital-to-analog controller, etc., or combinations thereof. Such control devices may include or be connected to a memory that stores instructions that may be read, interpreted and executed by the devices, and based on the executed instructions, perform any one of functions or control as described herein. The terms "memory" or "data storage device" used herein include any volatile or non-volatile computer memory suitable to the presently disclosed subject matter (e.g., random-access memory (RAM), static random-access memory (SRAM), read-only memory (ROM), erasable programmable read-only memory (EPROM), electrically erasable programmable read-only memory (EEPROM), dynamic random-access memory (DRAM), etc.). The above may include any of the control circuitry disclosed herein. More specifically, by way of non-limiting example, the above may include the control circuitry 140 disclosed in the present application. Control devices may be included or connected to interface hardware, that converts signals from other devices (e.g., sensors) to signals compatible with the control device (e.g., a comparator or analog to digital (A/D) converter that converts an analog signal to a digital signal), or that converts signals from the control device to signals compatible with another device (e.g., an amplifier for driving a control input of a switch). The control circuitry may be configured to output control signals to control an operational state (e.g., ON, OFF, opened, closed, etc.) of one or more switches.

Reference is now made to FIG. 1, which shows a power system 100.

Power system 100 may include one or more power sources 102. Each power source 102 may include one or more PV modules, e.g. a plurality of PV modules connected in series as a serial string of PV modules. Each PV module may include a plurality of PV cells, e.g. one or more serial strings of PV cells.

Power system 100 may include one or more power devices 104. Each power device 104 may include power converter circuitry. The power converter circuitry may include, for example, one or more: buck converter circuitry, boost converter circuitry, buck/boost converter circuitry, buck+boost converter circuitry, flyback converter circuitry, etc. The power devices 104 may be direct current (DC) to DC converters. The power converter circuitry may be configured to convert an input power to an output power.

Each power device 104 may include a plurality of input terminals TI connected to a plurality of output terminals TO of power source 102 (e.g., a PV module, a plurality of PV modules, etc.). Each power device 104 may include a plurality of power device output terminals TS. Each power device output terminal TS may be connected to a power device output terminal TS of a different power device 104, or may be connected to a DC bus 108.

A power device 104 together with one or more power sources 102 connected to the power device 104 may be referred to herein as a power module 106. Power system 100 may include one or more power modules 106. A plurality of power modules 106 may be connected to each other in series across DC bus 108 to form a series string 114 of power modules 106. The series string 114 of power modules may include a series string of serially connected power devices 104. Power system 100 may include one or more series strings 114 of power modules 106. The one or more series strings 114 of power modules 106 may be connected to a plurality of input terminals TP of one or more system power devices 110. The plurality of series strings 114 may be connected to each other in parallel via the input terminals TP of the one or more system power devices 110.

The one or more system power devices 110 may be, for example, one or more: DC to DC converters (e.g., buck converters, boost converters, buck/boost converters, buck+ boost converters, etc.), DC to AC converters (also referred to as inverters), combiner and/or monitoring boxes, etc. The one or more system power devices 110 may be an inverter for one or more phases (e.g., one-phase inverter, two-phase inverter, three-phase inverter, etc.), or may include lines or phases that are not shown herein for the sake of simplicity. The system power device may be configured to convert an input power to an output power.

System power device 110 may be connected to an electrical power grid 112. Series strings 114 may also be connected to one or more charge storage devices (e.g., batteries).

The terminals TI, TO, TS, and TP of the electrical devices (e.g., power sources 102, power devices 104, system power devices 110, etc.) of power system 100 may be connected to each other using electrical connectors 130 and electrical cables 132.

Each power device 104 may include circuitry 116A. Circuitry 116A may be configured to detect an arc condition and determine a location related to the arc condition. Circuitry 116A may include communication circuitry 118A configured to communicate with system power device 110. Communication circuitry 118A may include transmitter circuitry 120A and receiver circuitry 122A. Determining a location of the arc condition may be particularly useful when the electrical cable is relatively difficult to access (e.g. located underground).

Transmitter circuitry 120A of one of the power devices 104 may be configured to transmit communication signals to system power device 110 or a different power device 104 (e.g., via system power device 110). Transmitter circuitry 120A may be configured to transmit communication signals using wired communication (e.g., power line communication (PLC)) or wireless communication. Transmitter circuitry 120A may be configured to generate an applied voltage change between a power device of the power devices 104 and another power device of the power devices 104, or between the power device 104 and a power source 102. An applied voltage change may also be referred to herein as a voltage change. The applied voltage change may be a pulse voltage. The applied voltage change may be a step pulse voltage or a sine wave voltage. The applied voltage change may be a series of step pulse voltages or a series of sine wave voltages. The applied voltage change may have a rise time and a decay time. The applied voltage change may have a duration of about 10 ns. There may be a delay of about 50 ns between voltage changes. The applied voltage change may have a total duration of about 5-10 microseconds. For example, the applied voltage change may be a series of step pulse voltages with a total duration of about 5-10 microseconds with each step pulse having a duration of about 10 ns and there being a delay of about 50 ns between each step pulse. For example, a low-resolution voltage change may be provided by system power device 110 or when producing power, and a high-resolution voltage change may be provided by a power device 104 or when not producing power. The applied voltage change may have a voltage value in a range of about 0.25 Volts to about 5 Volts. The applied voltage change may have a voltage value in a range of about 100 mVolts to about 1000 mVolts (0.1 Volt to 1 Volt). The applied voltage change may help map impedances of the power system 100 and train the circuitry (e.g., in a training stage). The applied voltage change may help identify arc conditions (e.g., related to impending arcs or actual arcs) and may help provide a location associated with an arc condition (e.g., in an analysis stage). Transmitter circuitry 120A may be configured to generate an applied voltage change when the power system 100 (e.g., one or more power sources 102) is generating a substantial amount of power (e.g., middle of the day, weather with a relatively low amount of precipitation, a relatively low amount of shading, etc., when there is a relatively high voltage on the DC bus 108) or when the power system 100 is not generating a substantial amount of power (e.g., beginning or end of the day, weather with a relatively high amount of precipitation, a relatively high amount of shading, when the system lowers the power production e.g., in order to apply a voltage change in a training stage or an analysis stage, etc., when there is a relatively low voltage on the DC bus 108).

Transmitter circuitry 120A may include circuitry for generating a voltage change, such as pulse generator circuitry. The pulse generator circuitry may be connected to a source of voltage configured to supply the voltage for the voltage change.

Receiver circuitry 122A may be configured to receive communication signals from system power device 110 or a different power device 104 (e.g., via system power device 110). Receiver circuitry 122A may be configured to receive communication signals using wired communication (e.g., power line communication (PLC)) or wireless communication. Receiver circuitry 122A may be configured to receive a reflected voltage resulting from the voltage change applied between a power device 104 and another power device 104, or between a first power device 104 and a power source 102 associated with the first power device 104 (e.g., a power source 102 connected to the first power device 104). Reflected voltage may also be referred to herein as a reflection.

Each system power device 110 may include circuitry 116B. Circuitry 116B may be similar to circuitry 116A described above. Circuitry 116B may be configured to detect an arc condition and determine a location related to the arc condition. Circuitry 116B may include communication circuitry 118B configured to communicate with power devices 104. Communication circuitry 118B may include transmitter circuitry 120B and receiver circuitry 122B. Transmitter circuitry 120B may be similar to transmitter circuitry 120A described above. Receiver circuitry 122B may be similar to receiver circuitry 122A described above. Transmitter circuitry 120B may be configured to transmit communication signals to one or more power devices 104 (e.g., using wired (PLC) or wireless communication). Transmitter circuitry 120B may be configured to generate a voltage change to one or more power devices 104 or one or more power sources 102. Receiver circuitry 122B may be configured to receive communication signals (e.g., using wired (PLC) or wireless communication) from power device(s) 104. Receiver circuitry 122B may be configured to receive a reflected voltage resulting from the voltage change applied between the system power device 110 and one or more power devices 104, or between the system power device 110 and one or more power sources 102. Receiver circuitry 122B may be configured to receive data related to a reflected voltage resulting from the voltage change applied between a power device 104 and another power device 104.

Circuitry 116A and 116B may be configured to apply a voltage change to a series connection of electrical devices, wherein each electrical device comprises one of a plurality of impedances. Circuitry 116B may be part of a system power device and the series connection of devices may be a series string of power devices 104 and a plurality of connectors. Each of the estimated impedances may be associated with one of the power devices 104 or one of the plurality of connectors. Circuitry 116A may be part of a power device 104 and the series connection of devices may be a series string of PV modules and a plurality of connectors that are a part of the power source 102. Each of the estimated impedances may be associated with one of the PV modules or one of the plurality of connectors.

The plurality of impedances may each include a real impedance component and an imaginary impedance component. Applying the voltage change may be done periodically. Applying the voltage change may be done while the series connection of devices is producing substantial power (e.g., middle of the day, the sun is out, etc.). Applying the voltage change may be done while the series connection of devices is not producing substantial power (e.g., start of the day, end of the day, the sun is not out, etc.).

Circuitry 116A and 116B may be configured to receive a reflection resulting from the voltage change. Circuitry 116A, 116B may estimate the plurality of impedances based on the reflection, to determine a plurality of estimated impedances. The plurality of estimated impedances may each include an estimated real impedance component and an estimated imaginary impedance component.

Circuitry 116A and 116B may be configured to repeat the applying, receiving, and estimating, to collect multiple sets of estimated impedances. Circuitry 116A and 116B may send a notification based on the multiple sets of estimated impedances. Circuitry 116A, 116B may determine a change in the plurality of impedances, wherein the change comprises at least one of an increase of the real component, an increase of the imaginary component, a decrease of the real component, and/or a decrease of the imaginary component. Circuitry 116A and 116B may send the notification based on the determined change. Circuitry 116A and 116B may determine an increase in magnitude of the plurality of impedances, and send the notification based on the increase in magnitude. Circuitry 116A and 116B may determine an increase in phase angle of the plurality of impedances, and send the notification based on the increase in phase angle. The notification may be computer code. The notification may include a visual indication and/or a sound indication.

Circuitry 11A, 116B may be configured to use multiple sets of estimated impedances to determine a single master set of estimated impedances. The single master set of estimated impedances may be used to set a baseline in the training stage or may be compared to the baseline in the analysis stage. For example, multiple sets of estimated impedances may be consolidated into a single set of estimated impedances by performing an averaging operation on the multiple sets of estimated impedances.

Circuitry 116A and 116B may be configured to compare the multiple sets of estimated impedances and determine differences between the multiple sets of estimated impedances. Circuitry 116A and 116B may compare the multiple sets of estimated impedances by subtracting a first set of estimated impedances from a second set of estimated impedances. For example, the multiple sets may be compared to determine whether a more recent set of impedances indicates an arc condition. As another example, the multiple sets may be compared to determine whether a more recent set of impedances should be discarded.

Circuitry 116A and 116B may be configured to adjust sets of estimated impedances and send the notification based on the adjusted sets. The sets may be adjusted by discarding one or more sets of estimated impedances. The sets may be discarded based on noise.

Circuitry 116A and 116B may be configured to discard one or more sets of estimated impedances based on an averaging operation of the multiple sets. The averaging operation may be based on a moving average. The moving average may be used to smooth one or more sets of estimated impedances. For example, the averaging operation may be done over a period of time to get a clearer picture of the sets of estimated impedances, or to determine a single master set of estimated impedances. The averaging operation may be done to reduce noise associated with the sets of estimated impedances. The discarding of sets using the averaging operation may be performed based on a signal-to-noise ratio (SNR) threshold. A set of multiple sets may be discarded based on an SNR value associated with the set being greater than the SNR threshold. After discarding the set of estimated impedances based on noise, circuitry 116A and 116B may repeat the applying, receiving, and estimating to determine further sets of estimated impedances. An analysis of the multiple adjusted sets of estimated impedances may indicate an increase in impedance among the estimated impedances above a threshold.

Circuitry 116A and 116B may be configured to determine a trend associated with the plurality of sets of estimated impedances. Determining the trend may include at least one of determining a pattern in the multiple sets of estimated impedances, general linear model analysis of the multiple sets of estimated impedances, or Bayesian estimation of the multiple sets of estimated impedances. For example, machine learning may be used together with the multiple sets of estimated impedances in order to train the system, analyze further obtained sets of estimated impedances, and determine a trend in the sets of estimated impedances. The trend may indicate a change in the impedance of a device in the series connection of devices. The change in impedance may be an increase in impedance indicated by an increase in amplitude in the reflection. The change in impedance may be a decrease in impedance indicated by a decrease in amplitude in the reflection. The trend may indicate an arcing condition in the series connection of devices. The notification may comprise an arcing condition warning. The arcing condition warning may be a high-priority warning, medium-priority warning, or a low-priority warning. The warning may be based on the rate of change of the impedance or the impedance being above one of a plurality of thresholds. Determining the trend may include determining a change in one of the power devices or in one of the connectors. Determining the trend may include comparing a first change in a first device to a second change in a second device. Determining the change may include determining a change in power of the power device. Determining the change may include determining a change in impedance. The change in impedance may be at least one of a change in real impedance, a change in imaginary impedance, or a change in real impedance and imaginary impedance. Determining the trend may include determining an environmental parameter including at least one of weather, temperature, and/or time of day. Determining the trend may include determining a pattern. The pattern may indicate a future arcing condition and/or a future open circuit condition or short circuit condition. Determining the trend may include taking an average of the multiple sets of estimated impedances. Determining the trend may include grouping the multiple sets of estimated impedances. Grouping the multiple sets of estimated impedances may be based on high-power conditions, medium-power conditions, or low-power conditions.

Circuitry 116A and 116B may be configured to collect system parameters comprising at least one of voltage, current, or power. Circuitry 116A and 116B may be configured to group sets of the multiple sets based on ranges of the system parameters into a group of a plurality of groups. The plurality of groups may include a high-power group, a medium-power group, and a low-power group. Circuitry 116A and 116B may determine a trend based on the grouping of the multiple sets. Applying the voltage change may be done based on the system parameters being within a range.

The trend may be determined in the multiple sets of estimated impedances, for example by grouping the multiple sets of estimated impedances based on the system parameters.

Circuitry 116A and 116B may be configured to be trained in a training stage. For example, circuitry 116A and 116B may receive a plurality of reflections (ideally at similar power conditions, can be hourly, daily, weekly, monthly, annual, etc., at similar power conditions: during startup, low power, mid power, high power, with power dip, etc.) in order to train the circuitry 116A, 116B. For example, the training stage may be used to map estimated impedances of the power system 100 when there is no arc condition or only low-level arc conditions. The training stage may be performed over a period of time with multiple iterations of applying a voltage change, receiving a reflection, and estimating an impedance. During the training stage, a plurality of voltage changes with a plurality of reflections may be used to map the plurality of estimated impedances of the power system. The estimated impedances of the power system 100 may be grouped into a set of estimated impedances. Circuitry 116A and 116B may generate multiple sets of estimated impedances. For example, multiple sets of estimated impedances may be used to determine a master set of estimated impedances. The master set of estimated impedances may be used to determine a baseline for the expected impedances when the power system is monitored in the analysis stage. In some examples, there may be different master sets/baselines depending on other conditions of the power system (e.g., weather, temperature, power production, etc.). For example, there may be a high-power production master set that is used to determine a high power baseline. There may be a low power production master set that is used to determine a low power baseline, and so on. During training the sets of estimated impedances and/or a master set may be grouped based on related conditions (e.g., high power, low power, high humidity, low humidity, warm temperature, cool temperature, high illumination, low illumination, etc.). The voltage changes used to map the estimated impedances of the power system 100 may be applied between the system power device 110 and the power devices 104, between a first power device 104 and a second power device 104, between a power device 104, and a power source 102. The mapping in the training stage may be relatively high resolution or low resolution.

Circuitry 116A and 116B may be configured to monitor the power system 100 in an analysis stage. In the analysis stage, circuitry 116A and 116B may be configured to monitor the power system 100 to determine if there are any arc conditions in the power system. For example, circuitry 116A and 116B may be configured to determine estimated impedances of the power system 100 and determine when there is a change in the estimated impedances that indicates an arc condition. Circuitry 116A and 116B may be configured to send a notification based on a determined arc condition. The analysis stage may be similar to the training stage. The analysis stage may be performed over a period of time with multiple iterations of applying a voltage change, receiving a reflection, and estimating an impedance. During the analysis stage, a plurality of voltage changes with a plurality of reflections may be used to map the plurality of estimated impedances of the power system. The estimated impedances of the power system 100 may be grouped into a set of estimated impedances. Circuitry 116A and 116B may generate multiple sets of estimated impedances. For example, multiple sets of estimated impedances may be used to determine a master set of estimated impedances. The master set of estimated impedances may be used for comparison to a baseline from the training stage. As mentioned above, in some examples, there may be different master sets depending on other conditions of the power system (e.g., weather, temperature, power production, etc.). For example, there may be a high-power production master set that is compared to a high power baseline. There may be a low-power production master set that is compared to a low power baseline, and so on. During analysis, the sets of estimated impedances and/or a master set may be grouped based on related conditions (e.g., high power, low power, high humidity, low humidity, warm temperature, cool temperature, high illumination, low illumination, etc.). The voltage changes used to map the estimated impedances of the power system 100 may be applied between the system power device 110 and the power devices, between a first power device 104 and a second power device 104, or between a power device 104, and a power source 102. The mapping in the training stage may be relatively high resolution or low resolution. Determined changes in the analysis stage may indicate an arc condition (e.g., low priority, medium priority, or high priority).

Circuitry 116A and 116B may be configured to check if there have been changes in the reflections or estimated impedances. For example, circuitry 116A and 116B may be configured to check for relatively slow changes (e.g., due to contact oxidation due to water/moisture), step changes (e.g., due to installation of new parts or physical damage, relatively high rate changes (e.g., due to a critical arc). Circuitry 116A and 116B may be configured to compare changes with previous changes (e.g., in the same system or similar systems). Circuitry 116A and 116B may compare the changes with changes in one series string 114 compared to another series string 114 of the power system 100 (e.g., a first impedance between a first pair of power devices 104 compared to a second impedance between a second pair of power devices 104), or compared to other power systems 100 in a relatively close area (the changes might be a regional issue). Circuitry 116A and 116B may compare the changes with changes stored in a database (e.g., using AI/machine learning). Circuitry 116A and 116B may compare the changes with changes due to other reflections from different devices in the same system (e.g., using a power device 104 on the same series string 114 or a different series string 114). Circuitry 116A and 116B may compare changes with additional parameters (e.g., using PLC attenuation, voltages, currents, temperature). For example, even if there are changes detected in the estimated impedances, the circuitry 116A and 116B may determine that there is no arc condition, or a low-level arc condition since there are detected changes to multiple estimated impedances. For example, the detected changes to the multiple estimated impedances may be proportional to each other. As another example, even if there are changes detected in the estimated impedances, the circuitry 116A and 116B may determine that there is no arc condition or a low-level arc condition, since there are changes detected in weather (e.g., humidity), temperature, time of day, power production (greater power production or less power production), etc.

For example, circuitry 116A and 116B may send a voltage change (e.g., a voltage pulse with a width of about 10 ns). The reflected voltage may be received by circuitry of the system power device. The circuitry may save data related to the reflected voltage in computer memory. The circuitry 116 (e.g., of a power device 104 or a system power device 110) may send a second similar voltage change, and receive the reflected voltage related to the second voltage change, but may add a delay (e.g., about 50 ns) before sampling the reflection voltage and converting it from analog to digital (e.g., using an analog to digital converter 308 shown in FIG. 3 and FIG. 4). The circuitry 116 may apply a plurality of voltage changes in this manner, and each time the circuitry 116 may add an additional delay (e.g., about an additional 50 ns) each time before sampling the reflected voltage (e.g., for the third reflected voltage the delay will be about 100 ns, for the fourth reflected voltage the delay will be about 150 ns, etc.). The circuitry 116 may repeat this process for a certain amount of time (e.g., about 5-10 μs). The delayed sampling of the reflections is also referred to herein as a moving gate or a moving window. A switch of circuitry 116A and 116B may be configured to control the delays of the moving gate for sampling. A moving gate may allow the mapping of different impedances of the power system 100. For example, a first reflection with no delay in the sampling may be used to determine a first impedance of the power system 100, a second reflection with a first delay (e.g., about 50 ns) may be used to determine a second impedance of the power system 100, a third reflection with a second delay (e.g., about 100 ns) may be used to determine a third impedance of the power system 100, a fourth reflection with a third delay (e.g., about 150 ns) may be used to determine a fourth impedance of the power system 100, etc. This process may be used by the circuitry 116 in a training stage to map the plurality of impedances of the power system 100 (e.g., the impedances of a plurality of series strings 114 of electrical devices) and train the circuitry 116 for arc detection by providing a baseline of the impedances of the power system 100. This process may be used by circuitry 116 in an analysis stage to determine one or more arc conditions related to the power system 100 and to determine a location related to the determined arc condition. For example, using the total length of an electrical cable together with the time of the reflection, a location of the arc condition may be determined. The plurality of sets of estimated impedances of the plurality of reflections may be used to train the circuitry 116 in the training stage by providing a baseline that may be used to determine an arc condition based on one or more sets of estimated impedances of the plurality of reflections in the analysis stage. The voltage changes may have relatively low speeds with long data sampling times to get resolution (e.g., using the moving window method).

In some examples, the moving window method may be used to map the impedances of the power system 100. For example, circuitry 116 which is part of a system power device 110 and/or power device may be configured to map the impedances. Including circuitry 116A in power devices 104 allows for mapping to be done by circuitry 116A in power devices 104 that may be closer in proximity to other power devices 104, and power sources 102 than the system power device 110. For example, by using voltage changes between the system power device and power devices 104 or power sources 102 (e.g., using the moving window method) a relatively low-resolution map of the impedances may be determined. By using voltage changes between a power device 104 and other power devices 104 or power sources 102, a relatively higher resolution map of the impedances may be determined. This applies both to the training stage (e.g., when determining a baseline for the power system 100 when there is no arc condition) and the analysis stage (e.g., when using the baseline and map of impedances (low and/or high resolution) to determine an arc condition). The resolution of the mapping (high or low) may also depend on the applied voltage changes (e.g., their voltage value, shape, rise time, decay time, etc.). The applied voltage changes may depend on which elements of the power system 100 they are being applied to and from. The applied voltage changes may also depend on other factors like weather, temperature, power production (high, medium, or low), time of day (morning, mid-day, or night), illumination (high, medium, or low), etc.

In some examples, if the power system 100 is being shut down (e.g., the power sources 102 are disconnected from the power devices 104 due to the occurrence of an arc), the system power device 110 may use voltage changes and reflections to determine a location of the arc. For example, a rupture in the cable may be caused by a high impedance, and by comparing the one or more sets of estimated impedances of the plurality of reflections in the analysis stage to the one or more sets of estimated impedances of the plurality of reflections from the training stage, the circuitry may determine a location of the rupture where the failure that caused the arc is located along the cable.

In some examples, by comparing one or more sets of estimated impedances of the plurality of reflections in the analysis stage to the one or more sets of estimated impedances of the plurality of reflections from the training stage, the circuitry may determine an arc condition that indicates that an imminent arc may occur and a location related to this impending arc. This analysis may prevent the actual occurrence of the arc and may allow the problematic cable to be replaced in a relatively easy fashion.

The voltage change may be applied in a first direction of a first electrical polarity and the first reflection voltage may be received in a second opposite return direction of a second electrical polarity. The voltage change may be applied based on a timer. The voltage change may be applied periodically. The voltage change may be applied when the power system (e.g., one or more power sources) is not producing power above a power threshold or is producing power above a power threshold. In response to generating the notification, the power system 100 may be shut down (e.g. the power sources 102 may be disconnected from the power devices 104, the system power device 110, and/or the electrical power grid 112).

The power devices 104 may be located in relatively close proximity to each other (e.g., within a few feet of each other).

In some examples, circuitry 116B of the system power device 110 may be configured to determine an arc condition on the DC bus 108 (e.g., associated with electrical cables 132 connected directly to the DC bus), and circuitry 116A may be configured to determine an arc condition in the series string 114 (e.g., associated with electrical cables 132 connected between the power devices 104).

In some examples, control circuitry 140 may be configured to control operation of the circuitry 116A and 116B. Control circuitry 140 may be connected to one or more system power devices 110 and/or power devices 104 using any appropriate wired (e.g., PLC) or wireless connection (shown as dashed lines in FIG. 1). Control circuitry 140 may be internal to the one or more system power devices 110, or one or more power devices 104, or may be external from the more system power devices 110 and the one or more power devices 104. Control circuitry 140 may be configured to shut down the one or more system power devices 110 and the one or more power devices 104.

Figure 2:
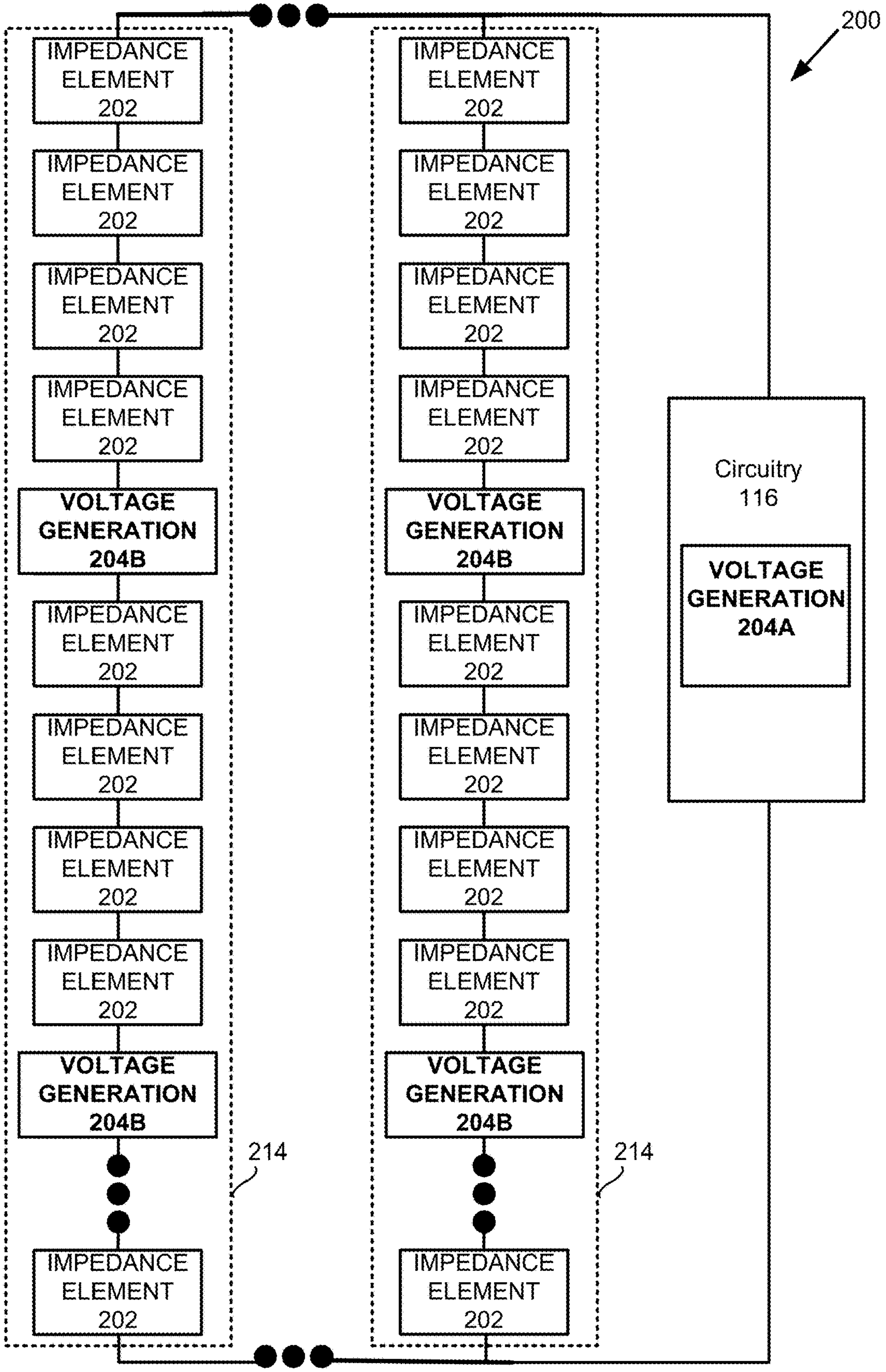
FIG. 2 shows an example diagram representing impedance elements.

Reference is now made to FIG. 2, which shows an example diagram representing impedance elements.

FIG. 2 shows impedances in a power system 200. Power system 200 may include a plurality of electrical devices and may be similar to the power system 100 of FIG. 1. The impedances may be mapped and monitored (e.g., in a training stage and an analysis stage). For example, power system 200 may have a plurality of impedance elements 202 connected in series forming a serial connection 214. This serial connection 214 may be similar to series string 114. Power system 200 may include a plurality of serial connections 214 connected in parallel, similar to a plurality of series strings 114 connected in parallel.

Each impedance element 202 may represent the impedance of an electrical device. For example, an impedance element 202 may represent the impedance of a power source 102, power device 104, power module 106, electrical connector 130, electrical cable 132, etc. Electrical cable 132 may have associated impedance characteristics, such as an inductance of the electrical cable and a capacitance of the electrical cable. If there is a break in the electrical cable forming a rupture, then the rupture of the electrical cable may be considered a relatively great impedance. The electrical cable 132 without rupture (e.g., an electrical cable 132 without failure) may generate a reflection with a relatively low amplitude. The electrical cable 132 with a relatively small rupture or an imminent rupture (e.g., an electrical cable 132 with a partial failure) may generate a reflection with a relatively medium amplitude. The electrical cable 132 with a relatively great rupture (e.g., an electrical cable 132 with a total failure) may generate a reflection with a relatively great amplitude.

Voltage generation circuitry 204 (voltage generation circuitry 204A, 204B) may be connected to serial connection 214. For example, a voltage generation circuitry 204A may be connected to a plurality of serial connections 214, similar to system power device 110 which may include the voltage generation circuitry 204A being connected to a plurality of series strings 114. Serially connected voltage generation circuitry 240B may be connected within a serial connection 214. Each serial connection 214 may include a plurality of serially connected voltage generation circuitry 240B connected in series within the series strings 114 (e.g., serial connection), similar to a plurality of power devices 104 which may include voltage generation circuitry 204B being connected in series in a series string 114. Voltage generation circuitry 204A and 204B may be part of circuitry 116A and 116B as described above.

As another example, the voltage generation circuitry 204A may be connected to a plurality of serial connections 214, similar to power device 104 which may include the voltage generation circuitry 204A being connected to a plurality of PV cell strings. In such an example, series strings 114 (e.g., serial connection) might not include the voltage generation circuitry 204B.

Figure 3:
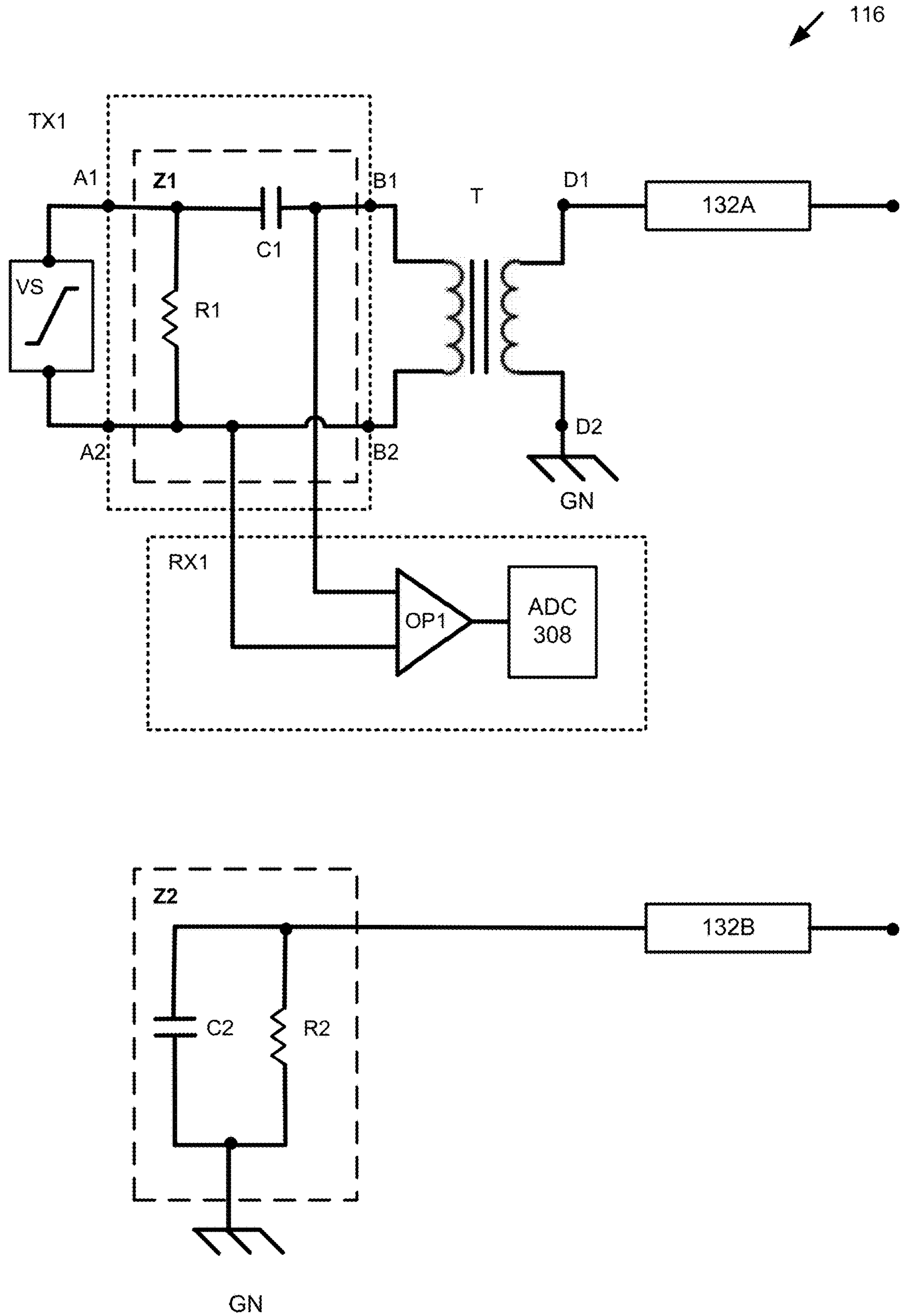
FIG. 3 shows an example circuitry.

Reference is now made to FIG. 3, which shows an example circuitry 116. Circuitry 116 may refer to circuitry 116A and/or circuitry 116B.

Circuitry 116 may include transmitter circuitry TX1 and receiver circuitry RX1.

Transmitter circuitry TX1 may include input terminals A1, A2 and output terminals B1, B2. Transmitter circuitry may include an impedance Z1 connected between input terminals A1, A2 and output terminals B1, B2. Impedance Z1 may be filter circuitry. Impedance Z1 may include a resistor R1 and a capacitor C1. Resistor A1 may be connected across input terminals A1, A2. Capacitor C1 may be connected between input terminal A1 and output terminal B1. Input terminal A2 may be connected to or the same as output terminal B2. Transmitter circuitry TX1 may be connected to a voltage source VS via input terminals A1 and A2. The voltage source VS may be configured to supply a voltage change to be applied by circuitry 116. Voltage source VS may be power source 102 or another external voltage supply. Transmitter circuitry TX1 may be connected to a transformer T via output terminals B1 and B2. Transformer T may have a first output terminal D1 connected to an electrical cable 132A. Electrical cable 132A may be connected to another electrical device of the power system 200. Transformer T may have a second output terminal D2 connected to a ground potential point GN. Receiver circuitry RX1 may be connected to output terminals B1 and B2. Receiver circuitry RX1 may include an amplifier OP1 and an analog-to-digital converter 308. Analog to digital converter 308 may be connected to control circuitry 140 or other processing circuitry or memory circuitry.

Transformer T may be considered as part of transmitter circuitry TX1 and/or part of receiver circuitry RX1.

Circuitry 116 may include a second impedance Z2. Impedance Z2 may include a resistor R2 and a capacitor C2. Resistor R2 and capacitor C2 may be connected in parallel. Impedance Z2 may be connected to an electrical cable 132B. Electrical cable 132B may be connected to another electrical device of the power system 200. Impedance Z2 may be matched to have a similar impedance to impedance Z1. Impedance Z2 may be the target of a voltage change applied by a power device 104 or system power device 110. A voltage change may be applied from the transmitter circuitry TX1 connected to electrical cable 132A towards the second impedance Z2 connected to electrical cable 132B of circuitry 116, or a second impedance Z2 of a different circuitry 116 (e.g., circuitry 116 in a different power device or a different system power device, etc.). Impedance Z2 may represent an expected impedance to be estimated from a received reflection (e.g., received by receiver circuitry RX1 connected to electrical cable 132A or other receiver circuitry RX1 of other circuitry 116) when there is no arc condition (e.g. no additional significant impedance from a rupture in an electrical cable 132).

As an example, if circuitry 116 is circuitry 116B of system power device 110, electrical cables 132A and 132B may be part of or connected to the DC bus 108. For example, electrical cable 132A may be connected to a negative line (DC−) of DC bus 108, and electrical cable 132B may be connected to a positive line (DC+) of DC bus 108 (or vice versa). As another example, if circuitry 116 is circuitry 116A of power device 104, electrical cables 132A and 132B may be part of or connected to the series string 114. For example, electrical cables 132A and 132B may be connected to other power devices 104 of the series string 114. For example, electrical cables 132A and 132B may be connected to power device output terminals TS of the power device 104. For example, electrical cable 132A may be connected to a negative power device output terminals TS and electrical cable 132B may be connected to a positive power device output terminals TS (or vice versa).

As an example, impedance Z1 and/or impedance Z2 may be part of an impedance element 202 shown in FIG. 2.

Figure 4:
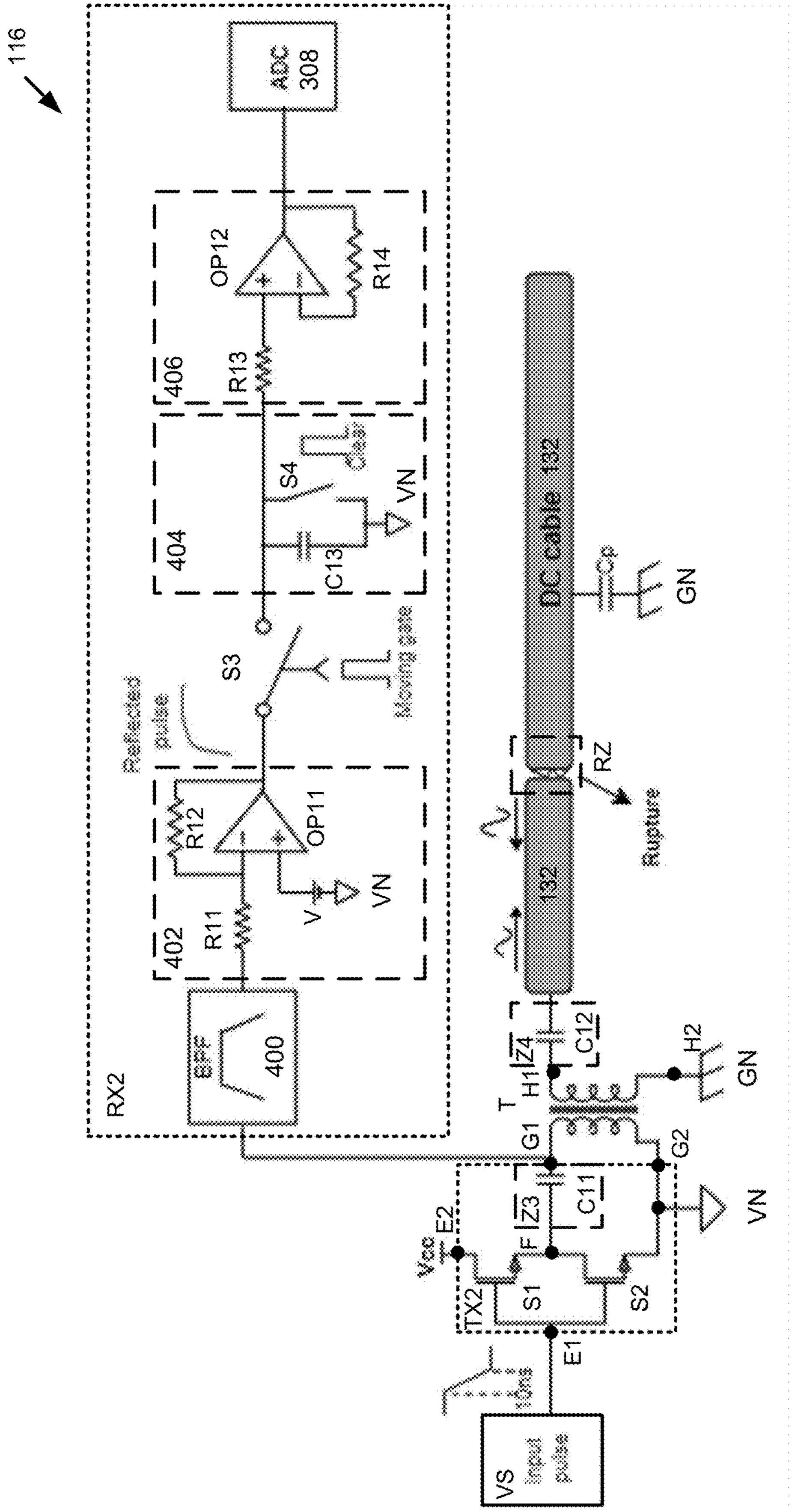
FIG. 4 shows an example circuitry.

Reference is now made to FIG. 4, which shows an example circuitry 116.

Circuitry 116 may include transmitter circuitry TX2 and receiver circuitry RX2.

Transmitter circuitry TX2 may include input terminals E1 and E2 and output terminals G1 and G2. Transmitter circuitry may include a first switch S1 connected to input terminals E1 and E2. The first switch S1 may be connected to a second switch S2 at terminal F. The second switch may also be connected to input terminal E1 and output terminal G2. An impedance Z3 may be connected between terminal F and output terminal G1. Impedance Z3 may be filter circuitry. Impedance Z3 may include a capacitor C11.

Transmitter circuitry TX2 may be connected to a first voltage source VS via input terminal E1. The voltage source VS may be configured to supply a voltage change to be applied by circuitry 116. Voltage source VS may be power source 102 or another external voltage supply.

Transmitter circuitry TX2 may be connected to a second voltage source Vcc via input terminal E2. The voltage source Vcc may be configured to supply a positive supply voltage to switch S1. Voltage source Vcc may be power source 102 or another external voltage supply.

Output terminal G2 may be connected to a virtual neutral potential point VN.

Transmitter circuitry TX2 may be connected to a transformer T via output terminals G1 and G2. Transformer T may have a first output terminal H1 connected to an electrical cable 132. Output terminal H1 may be connected to electrical cable 132 via an impedance Z4. Impedance Z4 may be filter circuitry. Impedance Z4 may include a capacitor C12. Electrical cable 132 may be connected to another electrical device of the power system 200. Electrical cable 132 may have a rupture RZ that may effectively be an impedance to the voltage change applied by the transmitter circuitry TX2 of circuitry 116. Rupture RZ may cause a reflected voltage that is received by receiver circuitry RX2. Rupture RZ may be a relatively high impedance (e.g., depending on how great the rupture in the cable is).

Transformer T may have a second output terminal H2 connected to a ground potential point GN.

Receiver circuitry RX2 may be connected to output terminal G1. Receiver circuitry RX2 may include amplifier circuitry 402 and 406, and filter circuitry 400 and 404. Filter circuitry 400 may be a band pass filter. Amplifier circuitry 402 may include a first operational amplifier OP11. Amplifier circuitry 406 may include a second operational amplifier OP12.

Receiver circuitry RX2 may include switch S3. Switch S3 may be configured to generate the moving gate when sampling received reflections. Switch S3 may be configured to help map the plurality impedances of the power system 100. For example, Switch S3 may be configured to generate a delay in the sampling of the reflections (e.g., a moving window delay of about 50 ns) so that a plurality of impedances of the power system 100 may be mapped.

Filter circuitry 400 may be connected to output terminal G1 and amplifier circuitry 402. Switch S3 may be connected between amplifier circuitry 402 and filter circuitry 404. Filter circuitry 404 may be connected to amplifier circuitry 406. Amplifier circuitry 406 may be connected to analog to digital converter 308.

Analog to digital converter 308 may be connected to control circuitry 140 or other processing circuitry or memory circuitry.

Transformer T may be considered as part of transmitter circuitry TX1 and/or part of receiver circuitry RX1.

Circuitry 116 may include a second matched impedance Z2 (for example, shown in FIG. 3). Second impedance Z2 may be matched to an impedance of circuitry 116. As an example, electrical cable 132 of FIG. 4 and electrical cable 132B of FIG. 3 may be part of or connected to the DC bus 108. For example, electrical cable 132 of FIG. 4 may be connected to a negative line (DC−) of DC bus 108 and electrical cable 132 of FIG. 4 may be connected to a positive line (DC+) of DC bus 108 (e.g., via power input terminals TP of system power device). As another example, electrical cables 132 of FIG. 4 and electrical cable 132B of FIG. 3 may be part of or connected to the series string 114. For example, electrical cables 132 of FIG. 4 and electrical cable 132B may be connected to other power devices 104 of the series string 114 (e.g., via output terminals TS).

Figure 5:
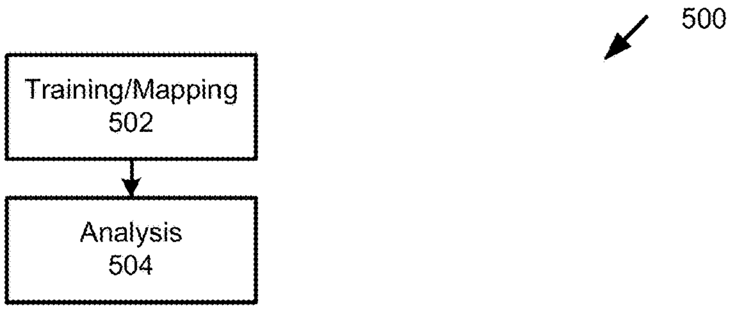
FIG. 5 shows an example flow diagram.

Reference is now made to FIG. 5 which shows an example of a method 500 for determining an arcing condition. The method 500 may be performed by circuitry 116. The method 500 may allow the identification of a potential arc and prevent an arc. The method 500 may identify an arc and determine the arc location.

In step 502, circuitry 116 is trained and a plurality of impedances in a power system are mapped. Step 502 is explained in further detail with reference to FIG. 6.

In step 504, circuitry 116 performs analysis based on the training and the mapping of the impedances of the power system done in step 502. Step 504 is explained in further detail with reference to FIG. 6 through FIG. 8.

Step 502 may be considered the training stage and step 504 may be considered the analysis stage.

Figure 6:
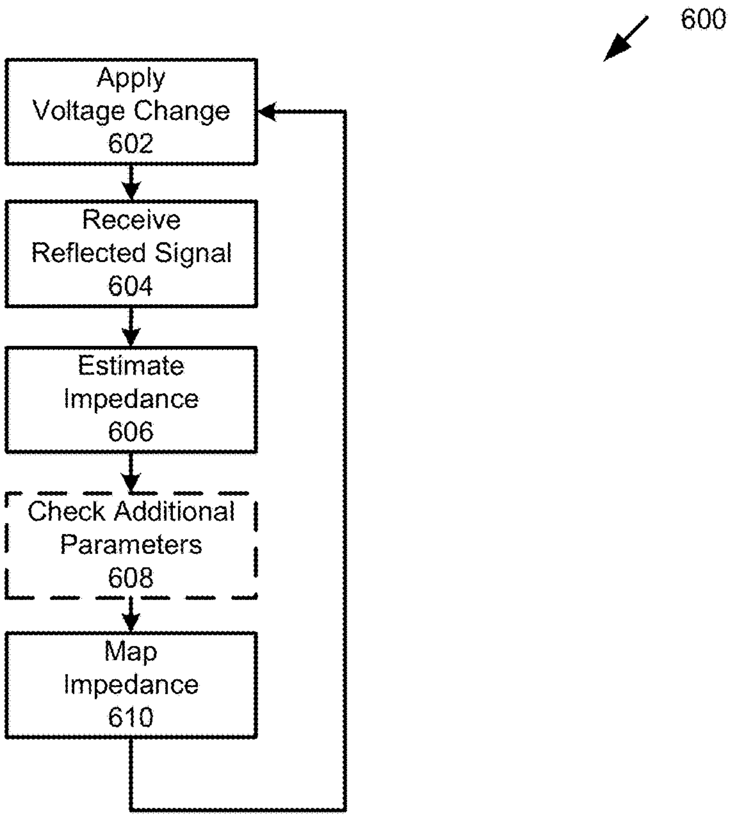
FIG. 6 shows an example flow diagram.

Reference is now made to FIG. 6 which shows an example method 600 for training circuitry 116 to determine an arcing condition.

In step 602, circuitry 116 applies a voltage change across a series connection of a plurality of electronic devices.

In step 604, circuitry 116 receives a reflection related to the applied voltage change.

In step 606, circuitry 116 determines an estimated impedance based on the reflection. Optionally, circuitry 116 may determine a location, which may include a distance, associated with the estimated impedance.

In step 608, circuitry 116 may optionally check additional parameters related to the power system 100. For example, circuitry 116 may check parameters such as power, current, voltage, temperature, weather, and/or illuminance, etc.

In step 610, circuitry 116 maps the estimated impedance based on the estimated impedance and optionally the determined location and additional parameters.

The circuitry 116 may be trained under relatively ideal conditions (e.g., no arcing conditions are present in the power system 100). The circuitry 116 may be trained by repeating the applying, receiving, estimating, checking, and mapping a plurality of times (represented in FIG. 6 by the return from step 610 to step 602). The circuitry 116 may be trained for a relatively long period of time (e.g., days, weeks, months, etc.). The training and mapping may be used to determine a baseline for the impedances of the power system. The training and mapping may be used to determine threshold values for the impedances of the power system. These threshold values may be used in the analysis stage to determine if there is an arc condition and the priority of the arc condition. The training and mapping may be used to determine a location, which may include a distance, related to an arc condition that is determined in the analysis stage.

Figure 7:
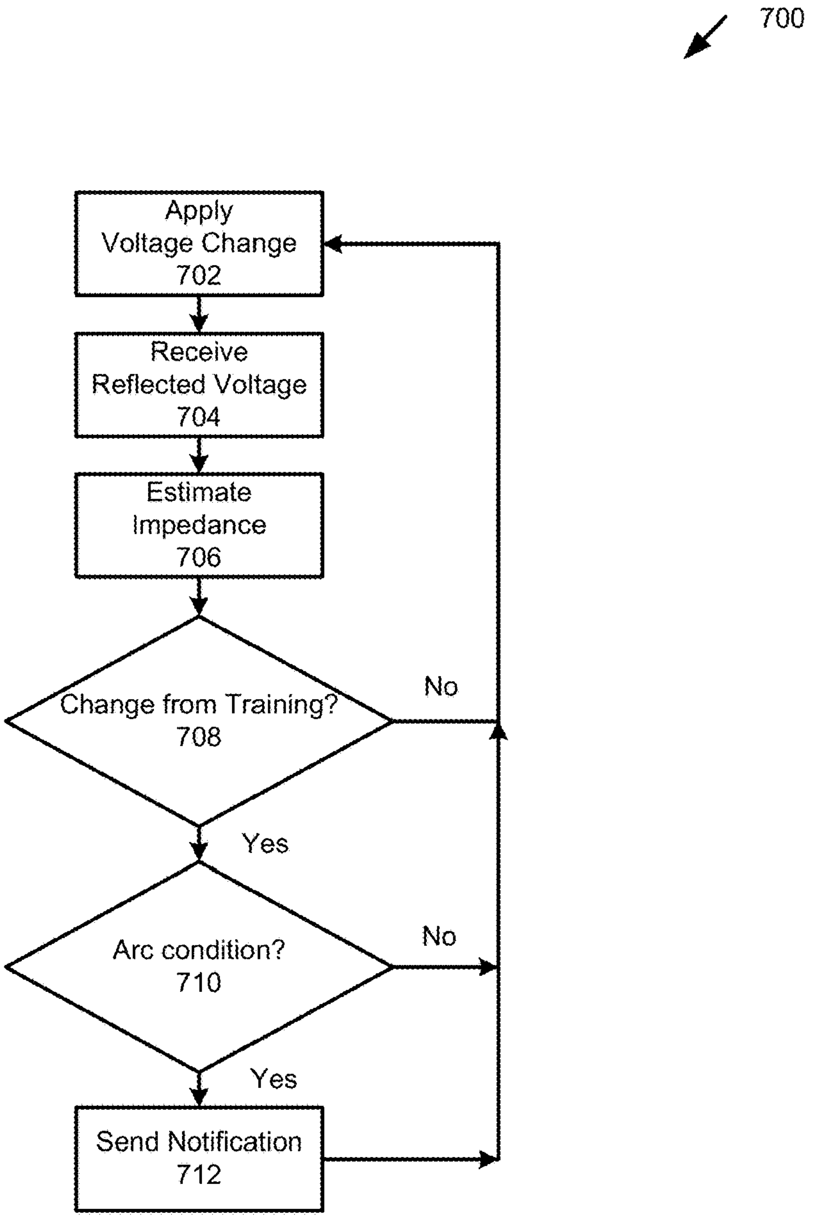
FIG. 7 shows an example flow diagram.

Reference is now made to FIG. 7 which shows an example of a method 700 for determining an arcing condition. The method 700 may be performed by circuitry 116. The method 700 may allow the identification of a potential arc and prevent an arc. The method 700 may identify an arc and determine the arc location.

Prior to step 702 circuitry 116 may be trained and the impedances of the power system 100 may be mapped.

In step 702, circuitry 116 applies a voltage change across a series connection of a plurality of electronic devices.

In step 704, circuitry 116 receives a reflection related to the applied voltage change.

In step 706, circuitry 116 determines an estimated impedance based on the reflection. Optionally, circuitry 116 may determine a location, which may include a distance, associated with the estimated impedance.

In step 708, circuitry 116 determines whether there is a change in the reflection based on the training and mapping. For example, circuitry 116 may compare the estimated impedance to a plurality of estimated impedances from the training stage. As another example, circuitry 116 may compare the estimated impedance to a plurality of estimated impedances from the analysis stage. As another example, circuitry 116 may compare the estimated impedance to an average impedance from the training stage.

If circuitry 116 determines that there is not a change in the reflection (or the change is less than a change threshold), then circuitry 116 may return to step 702.

If circuitry 116 determines that there is a change in the reflection (and the change is greater than a change threshold), then circuitry 116 may proceed to step 710.

In step 710, circuitry 116 determines whether there is an arc condition based on the determined change in the reflection. Circuitry 116 may also determine a priority for the arc condition. For example, circuitry 116 may compare the determined change to a threshold from the training stage. As another example, circuitry 116 may determine a level of change in amplitude in the reflection. As another example, circuitry 116 may check additional parameters such as power, current, voltage, temperature, weather, and/or illuminance, etc. As another example, circuitry 116 may compare the determined change to other determined changes based on other reflections of the system. For example, circuitry 116 may determine that all impedances in the power system increased relatively proportionally to each other (e.g., all or most impedances increased or decreased together). As another example, circuitry 116 may determine a level of noise (e.g., a signal-to-noise ratio (SNR) value) associated with the reflection. For example, if the SNR value is greater than an SNR threshold, then the estimated impedance related to the reflection may be discarded. As another example, the determined change may be compared to a trend determined in the training stage and/or the analysis stage.

If circuitry 116 determines that there is no arc condition, circuitry 116 may return to step 702.

If circuitry 116 determines that there is an arc condition, circuitry 116 may proceed to step 712.

In step 712, circuitry 116 may send a notification based on the arc condition. The notification may include an indication of how urgent/serious the condition is (e.g., low priority, medium priority, high priority). For example, low priority may indicate that an arc is forming but there is a relatively great amount of time until an actual arc. Medium priority may indicate that an arc is forming but there is a relatively small amount of time until an actual arc. High priority may indicate an arc has formed or is imminent. The notification may include a visual indication and/or a noise indication. The notification may include an indication related to a location, which may include a distance, of the arc condition. After circuitry 116 sends the notification, circuitry 116 may return to step 702.

Figure 8:
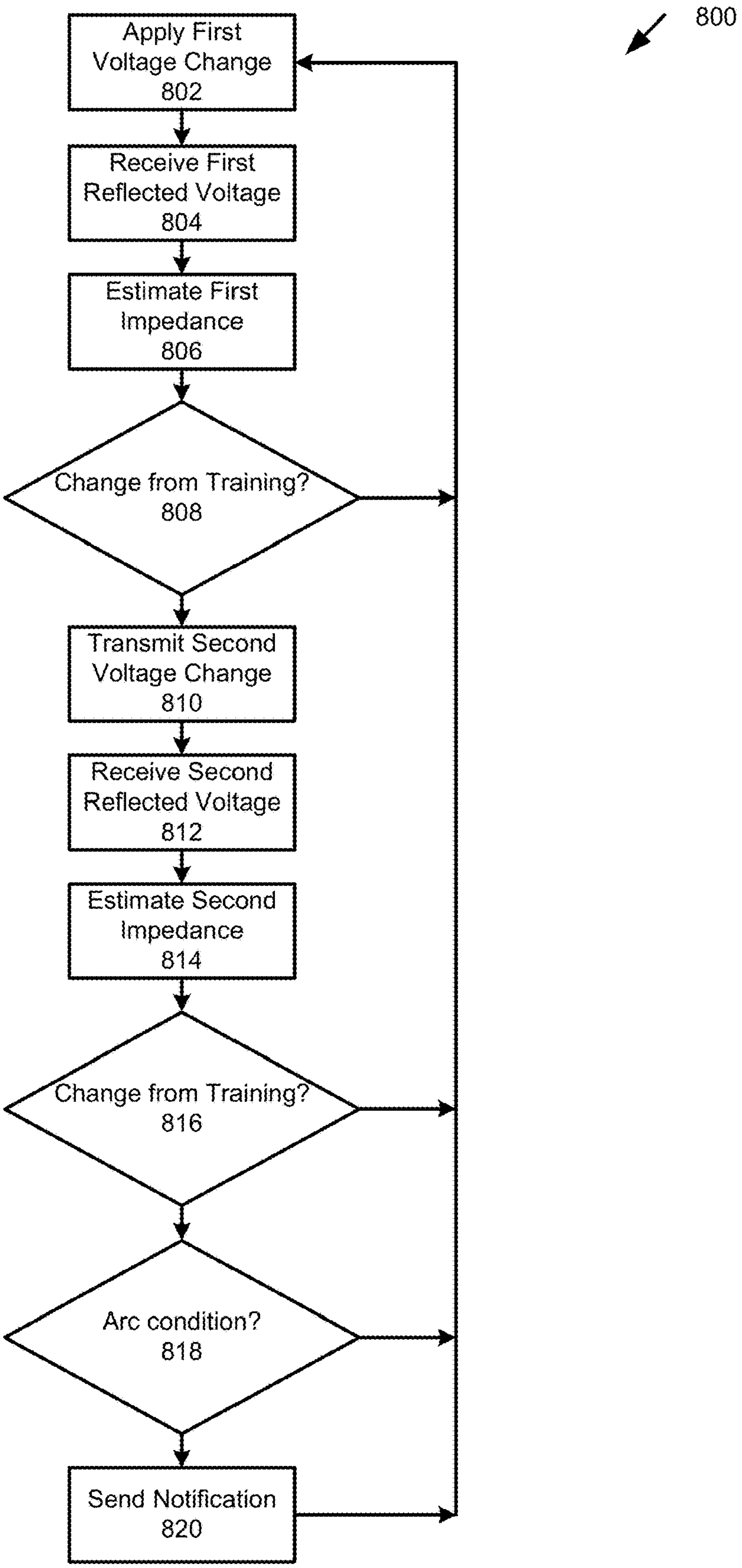
FIG. 8 shows an example flow diagram.

Reference is now made to FIG. 8 which shows an example of a method 800 for determining an arcing condition. The method 800 may be performed by circuitry 116. The method 800 may allow the identification of a potential arc and prevent an arc. The method 800 may identify an arc and determine the arc location.

Step 802 through step 808 may be similar to step 702 through step 708 of FIG. 7.

Step 810 through step 816 may also be similar to step 702 through step 708 of FIG. 7.

For example, step 802 through step 808 may be performed by a first power device and step 810 through step 816 may be performed by a second power device. For example, step 802 through step 808 may be performed by a system power device 110 and step 810 through step 816 may be performed by a power device 104 (e.g., closer to the determined change in impedance). As another example, step 802 through step 808 may be performed by a first power device 104, and step 810 through step 816 may be performed by a second power device 104 (e.g., closer to the determined change in impedance). In some examples, step 802 through step 816 may be performed by a single power device (e.g. system power device 110 or power device 104).

Step 818 may be similar to step 710. Step 818 may determine the arc condition using the estimated first impedance from step 806, and the estimated second impedance from step 814.

Step 820 may be similar to step 712.

According to the present disclosure, a method may comprises applying a plurality of voltage changes across a series connection of a plurality of devices, wherein each device of the plurality of devices comprises at least one of a plurality of impedances, receiving, based on the applied plurality of voltage changes, a plurality of reflections, determining, based on the plurality of reflections, a plurality of sets of estimated impedances, wherein each set of estimated impedances, of the plurality of sets of estimated impedances, is associated with the plurality of impedances, and sending, based on the plurality of sets of estimated impedances, a notification. The method, wherein each voltage change of the plurality of voltage changes across the series connection causes pulses across each device of the plurality of devices, and wherein each pulse comprises a rise time and a decay time. The method, wherein each impedance of the plurality of impedances comprises a real impedance component and an imaginary impedance component.

The method may further comprise determining, based on the plurality of sets of estimated impedances, an impedance change in the plurality of impedances, wherein the determined impedance change in the plurality of impedances comprises at least one of an increase of the real impedance component, an increase of the imaginary impedance component, a decrease of the real impedance component, or a decrease of the imaginary impedance component, wherein the sending the notification is based on the determined impedance change in the plurality of impedances. The method may further comprise applying a second plurality of voltage changes across the series connection of the plurality of devices, receiving, based on the applied second plurality of voltage changes, a second plurality of reflections, determining, based on the second plurality of reflections, a second plurality of sets of estimated impedances, and sending, based on the second plurality of sets of estimated impedances, a second notification, wherein each set of estimated impedances, of the second plurality of sets of estimated impedances, comprises a plurality of estimated impedance values respectively associated with corresponding set of impedances of the plurality of impedances.

The method may further comprise determining, based on the plurality of sets of estimated impedances, an increase in magnitude of the plurality of impedances, wherein the sending the notification is based on the increase in the magnitude. The method may further comprise determining, based on the plurality of sets of estimated impedances, an increase in phase angle of the plurality of impedances, wherein the sending the notification is based on the increase in the phase angle. The method may further comprise collecting a set of system parameters associated with the plurality of devices, the set of system parameters may comprises at least one of voltage, current, or power, and grouping, based on ranges of the set of system parameters, at least two sets of the plurality of sets of estimated impedances into at least two different groups of a plurality of groups. The method, wherein the plurality of groups comprise a high power group, a medium power group, and a low power group.

The method, may further comprise determining, based on the grouping, a trend associated with the plurality of impedances. The method, wherein each device of the plurality of devices comprises a power device and at least one connector through which each device is connected in series with another device of the plurality of devices, each set of estimated impedance of the plurality of sets of estimated impedances is associated with a power device of a device of the plurality of devices or a connector of a device of the plurality of devices, and the applying, the receiving, the determining, and the sending are performed by a system power device.

The method, wherein each power device, of each device of the plurality of devices, is connected to a respective photovoltaic (PV) module of a plurality of PV modules, each power device, of each device of the plurality of devices, comprises input terminals and output terminals, a first output terminal of the output terminals of the power device is coupled to a second output terminal of output terminals of another power device of another device of the plurality of devices, and the input terminals of the power device are coupled to the respective PV module of the plurality of PV modules. The method, wherein each power device, of each device of the plurality of devices, comprises input terminals and output terminals, a first output terminal of the output terminals of the power device is coupled to a second output terminal of output terminals of another power device of another device of the plurality of devices, and the input terminals of the power device are coupled to a plurality of photovoltaic (PV) modules.

The method, wherein the plurality of devices comprises a series string of a plurality photovoltaic (PV) modules and a plurality of connectors, each set of estimated impedance of the plurality of sets of estimated impedances is associated with a PV module of the plurality PV modules or a connector of the plurality of connectors, and a power device performs the method. The method may further comprise comparing a first set of estimated impedances of the plurality of sets of estimated impedances with a second set of estimated impedances of the plurality of sets of estimated impedances, wherein the sending the notification is further based on the comparing. The method, wherein the comparing comprises determining a difference between the first set of estimated impedances of the plurality of sets of estimated impedances and the second set of estimated impedances of the plurality of sets of estimated impedances.

The method may further comprise subtracting a first value associated with the first set of estimated impedances of the plurality of sets of estimated impedances from a second value associated with the second set of estimated impedances of the plurality of sets of estimated impedances. The method may further comprise determining a plurality of adjusted sets of estimated impedances by discarding a set of estimated impedances from the plurality of sets of estimated impedances, wherein the sending the notification is based on the plurality of adjusted sets. The method, wherein the discarding is based on a moving average operation performed on the plurality of sets of estimated impedances. The method, wherein the discarding is based on noise associated with the discarded set of estimated impedances. The method, wherein the discarding is based on a signal to noise ratio (SNR) threshold, and wherein the discarding is based on a SNR value associated with the discarded set of estimated impedances being greater than the SNR threshold.

The method, wherein an analysis of the plurality of adjusted sets indicates an increase in impedance above an impedance threshold. The method may further comprise determining a trend associated with the plurality of sets of estimated impedances. The method, wherein the determining the trend associated with the plurality of sets of estimated impedances comprises at least one of determining a pattern in the plurality of sets of estimated impedances, determining a general linear model of the plurality of sets of estimated impedances, or determining a Bayesian estimation of the plurality of sets of estimated impedances. The method, wherein the trend associated with the plurality of sets of estimated impedances indicates a change in impedance of a device of the plurality of devices.

The method, wherein the change in impedance is an increase in impedance indicated by an increase in amplitude in at least one reflection of the plurality of reflections. The method, wherein the change in impedance is a decrease in impedance indicated by a decrease in amplitude in at least one reflection of the plurality of reflections. The method, wherein the trend associated with the plurality of sets of estimated impedances indicates a short circuit condition, and wherein the notification comprises a short circuit condition warning. The method, wherein the trend associated with the plurality of sets of estimated impedances indicates an open circuit condition, and wherein the notification comprises an open circuit condition warning. The method, wherein the trend associated with the plurality of sets of estimated impedances indicates an arcing condition associated with the plurality of devices, and wherein the notification comprises an arcing condition warning.

The method, wherein the arcing condition warning is a high priority warning, medium priority warning, or a low priority warning, the trend associated with the plurality of sets of estimated impedances indicates a rate of change in an impedance of a device of the plurality of devices, and the arcing condition warning is based on the rate of change of the impedance or the impedance being above one of a plurality of impedance thresholds. The method, wherein the plurality of devices comprise a series string of power devices, and wherein the determining the trend associated with the plurality of sets of estimated impedances comprises determining a change in one of the power devices of the series string of power devices.

The method may further comprise determining a trend associated with the plurality of sets of estimated impedances, wherein the determining the trend associated with the plurality of sets of estimated impedances comprises determining a change in one of the plurality of connectors. The method, wherein the determining the trend associated with the plurality of sets of estimated impedances comprises comparing a first change in a first device of the plurality of devices to a second change in a second device of the plurality of devices. The method, wherein the determining the change comprises determining a change in power of the one of the power devices. The method, wherein the determining the change comprises determining a change in impedance. The method, wherein the change in impedance comprises at least one of a change in real impedance, a change in imaginary impedance, or a change in real impedance and imaginary impedance.

The method, wherein the determining the trend comprises determining an environmental parameter may comprises weather, temperature, or time of day. The method, wherein the determining the trend comprises determining a pattern. The method, wherein the pattern indicates a future arcing condition. The method, wherein the pattern indicates a future open circuit condition. The method, wherein the determining the trend comprises grouping the plurality of sets of estimated impedances. The method, wherein the grouping the plurality of sets of estimated impedances is based on high power conditions, medium power conditions, or low power conditions. The method may further comprise determining a trend in the plurality of sets of estimated impedances, wherein the determining the trend comprises grouping the plurality of sets of estimated impedances based on the set of system parameters.

The method, wherein the determining the trend comprises determining an average associated with the plurality of sets of estimated impedances. The method, wherein the applying is performed periodically. The method, wherein the applying is performed based on the set of system parameters being within a range. The method, wherein the applying is performed while the plurality of devices are producing power greater than a power threshold. The method, wherein the applying is performed while the plurality of devices are producing power less than a power threshold. The method, wherein the applying is performed using power line communication (PLC). The method, wherein the notification comprises at least one of a computer code, a visual indication, or a sound indication. The method, wherein the plurality of devices comprise a current loop may comprises a single input current conductor connected to a positive voltage, and a single output current conductor connected to a negative voltage.

According to the present disclosure, an apparatus may comprises a pulse generator configured to apply a voltage change across a series connection of a plurality of devices, wherein each device of the plurality of devices comprises at least one of a plurality of impedances, a receiver configured to receive, based on the applied voltage change, a reflection, and circuitry configured to estimate, based on the reflection, the plurality of impedances, collect, based on the estimated plurality of impedances, a plurality of sets of estimated impedances, and send, based on the plurality of sets of estimated impedances, a notification. The apparatus, wherein the pulse generator is configured to apply a second voltage change across the series connection of the plurality of devices, the receiver is configured to receive, based on the applied second voltage change, a second reflection, the circuitry is configured to estimate, based on the second reflection, a second plurality of impedances, and the plurality of sets of estimated impedances comprises the estimated plurality of impedances and the estimated second plurality of impedances. The apparatus, wherein the estimated plurality of impedances correspond to a first set of the plurality of sets of estimated impedances, and the estimated second plurality of impedances correspond to a second set of the plurality of sets of estimated impedances.

According to the present disclosure, a method may comprises applying, by a first power device connected to a second power device, a first voltage change via an electrical cable, receiving, by the first power device, a first reflection associated with the first voltage change, determining, based on the first reflection, a first arcing condition of the electrical cable, applying, by the first power device to the second power device, a second voltage change via the electrical cable, receiving, by the first power device, a second reflection associated with the second voltage change, determining, based on the second reflection, a second arcing condition of the electrical cable, and sending, based on the first arcing condition and the second arcing condition, a notification. The method, wherein the first arcing condition indicates a non-arcing state of the electrical cable. The method, wherein the first arcing condition is used as a baseline to determine an arcing threshold. The method, wherein the first arcing condition indicates a low priority arcing state of the electrical cable. The method, wherein the second arcing condition indicates an arcing state of the electrical cable.

The method, wherein the second arcing condition indicates one of a high priority arcing state, a medium priority arcing state, or a low priority arcing state. The method, wherein the notification is one of a high priority notification based on the high priority arcing state, a medium priority notification based on the medium priority arcing state, or a low priority notification based on the low priority arcing state. The method may further comprise comparing the first arcing condition with the second arcing condition to determine that the notification should be sent. The method, wherein at least one of the first and second voltage changes is a step pulse voltage change. The method, wherein at least one of the first and second voltage changes has a duration of about 10 ns. The method, wherein at least one of the first and second voltage changes has a voltage value of about 0.25 Volts to about 5 Volts. The method, wherein the first and second voltage changes each have a voltage value of about 100 mVolts to about 1000 mVolts.

The method may further comprise determining, based on a third reflection, a third arcing condition of the electrical cable, wherein the sending the notification is further based on the third arcing condition. The method may further comprise receiving the third reflection by the first power device, the second power device, or a third power device. The method, wherein the third reflection is associated with a third voltage change, and wherein the third voltage change is applied by the first power device, the second power device, or the third power device. The method, wherein at least one of the first and second arcing conditions is indicative of an impedance of the electrical cable. The method, wherein the second arcing condition indicates a change in impedance in the electrical cable. The method, wherein the second arcing condition indicates a rupture in the electrical cable. The method may further comprise calculating, based on the second arcing condition, a location of the rupture in the electrical cable.

The method, wherein the notification comprises an indication of the location. The method may further comprise using the first arcing condition as a training condition. The method, wherein the determining the second arcing condition is based on the training condition. The method may further comprise mapping, using a plurality of reflections, a system may comprises the first power device and the second power device, wherein the determining the first arcing condition and the second arcing condition are based on the mapping. The method, wherein at least one of the first and second power devices comprises a power converter. The method, wherein the power converter is a direct current (DC) to DC converter. The method, wherein at least one of the first and second power devices comprises a system power device. The method, wherein the first power device is connected to a first power source.

The method, wherein the second power device is connected to a second power source. The method, wherein the first power source is a photovoltaic (PV) power source. The method, wherein the second power source is a photovoltaic (PV) power source. The method, wherein the applying the first voltage change comprises applying the first voltage change in a first direction of a first electrical polarity, and wherein the receiving the first reflection comprises receiving the first reflection in a second direction that is opposite to the first direction of a second electrical polarity that is opposite to the first electrical polarity. The method, wherein at least one of the applying the first voltage change or the applying the second voltage change is based on a timer. The method, wherein at least one of the applying the first voltage change or the applying the second voltage change is performed periodically. The method, wherein at least one of the applying the first voltage change or the applying the second voltage change is based on the first power source being not producing power above a power threshold. The method, wherein at least one of the applying the first voltage change or the applying the second voltage change is based on the first power source being producing power above a power threshold.

The method may further comprise shutting down a system in response to the notification. The method, wherein at least one of the first and second power devices is part of a series string of serially connected power devices. The method, wherein the series string is connected in parallel to at least one other series string. The method, wherein the first power device comprises communication circuitry for communicating with the second power device. The method, wherein the communication circuitry comprises transmitter circuitry and receiver circuitry. The method may further comprise detecting a temperature parameter. The method, wherein the sending the notification is further based on the temperature parameter. The method may further comprise detecting a weather parameter. The method, wherein the sending the notification is further based on the weather parameter. The method, wherein the first power device is located in a relatively close proximity to the second power device.

According to the present disclosure, an apparatus may comprises a first power device coupled to a second power device via an electrical cable, first circuitry configured to apply a plurality of voltage changes via the electrical cable to the second power device, receiver circuitry configured to receive a plurality of reflections associated with the plurality of voltage changes, and second circuitry configured to determine, based on the plurality of reflections, a plurality of arcing conditions associated with the electrical cable, and send, based on the plurality of arcing conditions, a notification.

According to the present disclosure, a method may comprises applying, from a first power device to a second power device, a plurality of voltage change via an electrical cable, receiving a plurality of reflections associated with the plurality of voltage changes, determining, based on the plurality of reflections, a plurality of arcing conditions associated with the electrical cable, and sending, based on the plurality of arcing conditions, a notification.

According to the present disclosure, a system may comprises a first power device, a second power device, circuitry, an electrical cable, wherein the electrical cable connects the first power device to the second power device, the first power device is configured to apply a first voltage change to the second power device via the electrical cable, the first power device is configured to receive a first reflection associated with the first voltage change, the circuitry is configured to determine, based on the first reflection, a first arcing condition associated with the electrical cable, the first power device is configured to apply a second voltage change to the second power device via the electrical cable, the first power device is configured to receive a second reflection associated with the second voltage change, the circuitry is configured to determine, based on the second reflection, a second arcing condition associated with the electrical cable, and the circuitry is configured to send, based on the first arcing condition and the second arcing condition, a notification.

According to the present disclosure, a system may comprises a plurality of power sources, a plurality of power devices, wherein each power device of the plurality of power devices is coupled to a respective power source of the plurality of power sources, and wherein each power device of the plurality of power devices is configured to receive a first reflection associated with a first voltage change, determine, based on the first reflection, a first condition, receive a second reflection associated with a second voltage change, determine, based on the second reflection, a second condition, and send, based on the first condition and the second condition, a notification. The system, wherein each power device of the plurality of power devices comprises transmitter circuitry and receiver circuitry.

According to the present disclosure, a method may comprises applying a plurality of voltage changes across a series connection of a plurality of devices, wherein each of the plurality of devices comprises one of a plurality of impedances, receiving, based on the applied plurality of voltage changes, a plurality of reflections, determining, based on the plurality of reflections, a plurality of sets of estimated impedances, wherein each set of estimated impedances, of the plurality of sets of estimated impedances, is associated with the plurality of impedances, determining, based on the plurality of sets of estimated impedances, at least one evaluation parameter associated with the plurality of impedances, applying a second plurality of voltage changes across the series connection of the plurality of devices, receiving, based on the applied second plurality of voltage changes, a second plurality of reflections, determining, based on the second plurality of reflections, a second plurality of sets of estimated impedances, wherein each set of estimated impedances, of the second plurality of sets of estimated impedances, is associated with the plurality of impedances, and determining, based on the at least one evaluation parameter associated with the plurality of impedances and based on the second plurality of sets of estimated impedances, an abnormality associated with at least one impedance of the plurality of impedances, and sending, based on the abnormality associated with at least one impedance of the plurality of impedances, a notification.

The method, wherein the at least one evaluation parameter associated with the plurality of impedances comprises at least one evaluation parameter for a plurality of types of impedance changes. The method, wherein the plurality of types of impedance changes comprises at least one of a first rate of impedance change, a second rate of impedance change. The method, wherein the plurality of types of impedance changes comprises at least one of an impedance change trend associated with one or more weather conditions, an impedance change trend associated with humidity, an impedance change trend associated with temperature, an impedance change trend associated with times of day, or an impedance change trend associated with power production. The method, wherein the abnormality associated with at least one impedance of the plurality of impedances comprises an arcing condition.

According to the present disclosure, a method may comprises determining, based on a training data set, at least one evaluation parameter associated with a plurality of impedances, wherein a series connection of a plurality of devices comprises the plurality of impedances, applying a plurality of voltage changes across the series connection of the plurality of devices, receiving, based on the applied plurality of voltage changes, a plurality of reflections, determining, based on the plurality of reflections, a plurality of sets of estimated impedances, wherein each set of estimated impedances, of the plurality of sets of estimated impedances, is associated with the plurality of impedances, and determining, based on the at least one evaluation parameter associated with the plurality of impedances and based on the plurality of sets of estimated impedances, an abnormality associated with at least one impedance of the plurality of impedances, and sending, based on the abnormality associated with at least one impedance of the plurality of impedances, a notification.

The method, wherein the at least one evaluation parameter associated with the plurality of impedances comprises at least one evaluation parameter for a plurality of types of impedance changes. The method, wherein the plurality of types of impedance changes comprises at least one of a first rate of impedance change, a second rate of impedance change. The method, wherein the plurality of types of impedance changes comprises at least one of an impedance change trend associated with one or more weather conditions, an impedance change trend associated with humidity, an impedance change trend associated with temperature, an impedance change trend associated with times of day, or an impedance change trend associated with power production. The method, wherein the abnormality associated with at least one impedance of the plurality of impedances comprises an arcing condition.

Although examples are described above, features and/or steps of those examples may be combined, divided, omitted, rearranged, revised, and/or augmented in any desired manner. Various alterations, modifications, and improvements will readily occur to those skilled in the art. Such alterations, modifications, and improvements are intended to be part of this description, though not expressly stated herein, and are intended to be within the spirit and scope of the disclosure. Accordingly, the foregoing description is by way of example only and is not limiting.

The invention claimed is:

1. A method comprising:

applying, by a system power device, a plurality of voltage changes across a series connection of a plurality of devices, wherein each device of the plurality of devices comprises at least one of a plurality of impedances, and wherein each device of the plurality of devices comprises a power device and at least one connector through which each device is connected in series with another device of the plurality of devices;

receiving, by the system power device and based on the applied plurality of voltage changes, a plurality of reflections;

determining, by the system power device and based on an initial part of the plurality of reflections, a first set of estimated impedances associated with the plurality of impedances;

after determining the first set of estimated impedances and based on a later part of the plurality of reflections, determining, by the system power device, a second set of estimated impedances associated with the plurality of impedances, wherein each set of estimated impedance of the first set of estimated impedances and the second set of estimated impedances is associated with a power device of a device of the plurality of devices or a connector of a device of the plurality of devices;

detecting, by the system power device, an arc condition based on the second set of estimated impedances deviating from the first set of estimated impedances by greater than a threshold amount; and outputting, by the system power device and based on the detected arc condition, a control signal configured to disconnect at least one device of the plurality of devices.

2. The method of claim 1, wherein each voltage change of the plurality of voltage changes across the series connection causes pulses across each device of the plurality of devices, and wherein each pulse comprises a rise time and a decay time.

3. The method of claim 1, wherein each impedance of the plurality of impedances comprises a real impedance component and an imaginary impedance component.

4. The method of claim 3, further comprising:

determining, based on the first set of estimated impedances and the second set of estimated impedances, an impedance change in the plurality of impedances, wherein the determined impedance change in the plurality of impedances comprises at least one of:

an increase of the real impedance component, an increase of the imaginary impedance component, a decrease of the real impedance component, or a decrease of the imaginary impedance component, wherein the outputting of the control signal is based on the determined impedance change in the plurality of impedances.

5. The method of claim 1, further comprising:

applying a second plurality of voltage changes across the series connection of the plurality of devices; and receiving, based on the applied second plurality of voltage changes, the later part of the plurality of reflections, wherein the second set of estimated impedances comprises a plurality of estimated impedance values respectively associated with a corresponding set of impedances of the plurality of impedances.

6. The method of claim 1, further comprising:

determining, based on the first set of estimated impedances and the second set of estimated impedances, an increase in magnitude of the plurality of impedances, wherein the outputting of the control signal is based on the increase in magnitude.

7. The method of claim 1, further comprising:

determining, based on the first set of estimated impedances and the second set of estimated impedances, an increase in phase angle of the plurality of impedances, wherein the outputting of the control signal is based on the increase in phase angle.

8. The method of claim 1, further comprising:

collecting a set of system parameters associated with the plurality of devices, the set of system parameters comprising at least one of: voltage, current, or power; and grouping, based on ranges of the set of system parameters, at least the first set of estimated impedances and the second set of estimated impedances into at least two different groups of a plurality of groups.

9. The method of claim 8, wherein the plurality of groups comprise a high power group, a medium power group, and a low power group.

10. The method of claim 8, further comprising:

determining, based on the grouping, a trend associated with the plurality of impedances.

11. The method of claim 1, wherein:

each power device, of each device of the plurality of devices, is connected to a respective photovoltaic (PV) module of a plurality of PV modules, each power device, of each device of the plurality of devices, comprises input terminals and output terminals, a first output terminal of the output terminals of the power device is coupled to a second output terminal of output terminals of another power device of another device of the plurality of devices, and the input terminals of the power device are coupled to the respective PV module of the plurality of PV modules.

12. The method of claim 1, wherein:

each power device, of each device of the plurality of devices, comprises input terminals and output terminals, a first output terminal of the output terminals of the power device is coupled to a second output terminal of output terminals of another power device of another device of the plurality of devices, and the input terminals of the power device are coupled to a plurality of photovoltaic (PV) modules.

13. The method of claim 1, wherein:

the plurality of devices comprises a series string of a plurality of photovoltaic (PV) modules and a plurality of connectors;

each set of estimated impedance of the first set of estimated impedances and the second set of estimated impedances is associated with a PV module of the plurality of PV modules or a connector of the plurality of connectors; and a power device performs the method.

14. The method of claim 1, further comprising:

comparing the first set of estimated impedances with the second set of estimated impedances, wherein the outputting of the control signal is further based on the comparing.

15. The method of claim 14, wherein the comparing comprises determining a difference between the first set of estimated impedances and the second set of estimated impedances.

16. The method of claim 14, further comprising:

subtracting a first value associated with the first set of estimated impedances from a second value associated with the second set of estimated impedances.

17. The method of claim 1, further comprising:

determining a plurality of adjusted sets of estimated impedances by:

discarding a set of estimated impedances from the first set of estimated impedances and the second set of estimated impedances, wherein the of outputting of the control signal is based on the plurality of adjusted sets.

18. A system power device comprising:

a pulse generator configured to apply a voltage change across a series connection of a plurality of devices, wherein each device of the plurality of devices comprises at least one of a plurality of impedances, and wherein each device of the plurality of devices comprises a power device and at least one connector through which each device is connected in series with another device of the plurality of devices;

a receiver configured to receive, based on the applied voltage change, a plurality of reflections; and circuitry configured to:

estimate, based on an initial part of the plurality of reflections, a first set of impedances associated with the plurality of impedances, after estimating the first set of impedances and based on a later part of the plurality of reflections, estimate a second set of impedances associated with the plurality of impedances, wherein each set of estimated impedance of the first set of estimated impedances and the second set of estimated impedances is associated with a power device of a device of the plurality of devices or a connector of a device of the plurality of devices, detect an arc condition based on the second set of estimated impedances deviating from the first set of estimated impedances by greater than a threshold amount, and output, based on the detected arc condition, a control signal configured to disconnect at least one device of the plurality of devices.

19. The system power device of claim 18, wherein:

the pulse generator is configured to apply a second voltage change across the series connection of the plurality of devices; and the receiver is configured to receive, based on the applied second voltage change, the later part of the plurality of reflections, wherein the second set of estimated impedances comprises a plurality of estimated impedance values respectively associated with a corresponding set of impedances of the plurality of impedances.

* * * * *